(12) United States Patent
Shau

(10) Patent No.: US 6,427,222 B1
(45) Date of Patent: *Jul. 30, 2002

(54) INTER-DICE WAFER LEVEL SIGNAL TRANSFER METHODS FOR INTEGRATED CIRCUITS

(76) Inventor: Jeng-Jye Shau, 991 Amarillo Ave., Palo Alto, CA (US) 94303

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/941,786

(22) Filed: Sep. 30, 1997

(51) Int. Cl.[7] .............................................. G06F 17/50
(52) U.S. Cl. .............................................. 716/4; 716/5
(58) Field of Search ................................ 364/488, 489, 364/490, 491; 438/15, 16, 17, 18, 26, 29; 716/19, 1, 4, 8–14

(56) References Cited

U.S. PATENT DOCUMENTS

| | | | |
|---|---|---|---|
| 5,399,505 A | | 3/1995 | Dasse et al. ................. 438/17 |
| 5,442,282 A | * | 8/1995 | Rostoker et al. ......... 324/158.1 |
| 5,489,538 A | | 2/1996 | Rostoker et al. ............. 438/15 |
| 5,504,369 A | | 4/1996 | Dasse et al. ................. 257/620 |
| 5,512,710 A | * | 4/1996 | Schroeder ................. 174/52.4 |
| 5,532,174 A | | 7/1996 | Corrigan ..................... 438/18 |
| 5,593,903 A | | 1/1997 | Beckenbaugh et al. ....... 438/18 |
| 5,617,531 A | * | 4/1997 | Crouch et al. ......... 395/186.06 |
| 5,701,666 A | * | 12/1997 | DeHaven et al. ............. 29/831 |
| 5,732,209 A | * | 3/1998 | Vigil et al. ............ 395/183.06 |
| 5,838,163 A | * | 11/1998 | Rostoker et al. ............ 324/763 |
| 5,949,242 A | * | 9/1999 | Wood et al. ................. 324/760 |
| 6,049,977 A | * | 4/2000 | Atkins et al. .................. 29/843 |

* cited by examiner

*Primary Examiner*—Vuthe Siek
(74) *Attorney, Agent, or Firm*—Bo-In Lin

(57) ABSTRACT

The present invention discloses novel methods to transfer data between a plurality of integrated circuit dice on a semiconductor wafer. Each individual die contains internal circuits to control data transfer to nearby dice. Wafer level data transfer is achieved by a series of inter-dice data transfers. It is therefore possible to use a small number of small area metal lines to support wafer level parallel processing activities. External connections are provided by a small number of bonding pads on each wafer. The load on each external bounding pad is by far lower than that of prior art wafer level connections. These inter-dice data transfer mechanism also can be programmed to avoid defective circuitry.

This invention has been used to support wafer level functional tests and wafer level burn-in tests. A Testing system of the present invention can test thousands of dice in parallel using simple testing equipment. Testing costs for integrated circuits are therefore reduced dramatically. The present application also make it possible to build large area IC containing multiple dice. Extremely powerful products are realized using parallel processing capability of such multiple die integrated circuits.

2 Claims, 26 Drawing Sheets

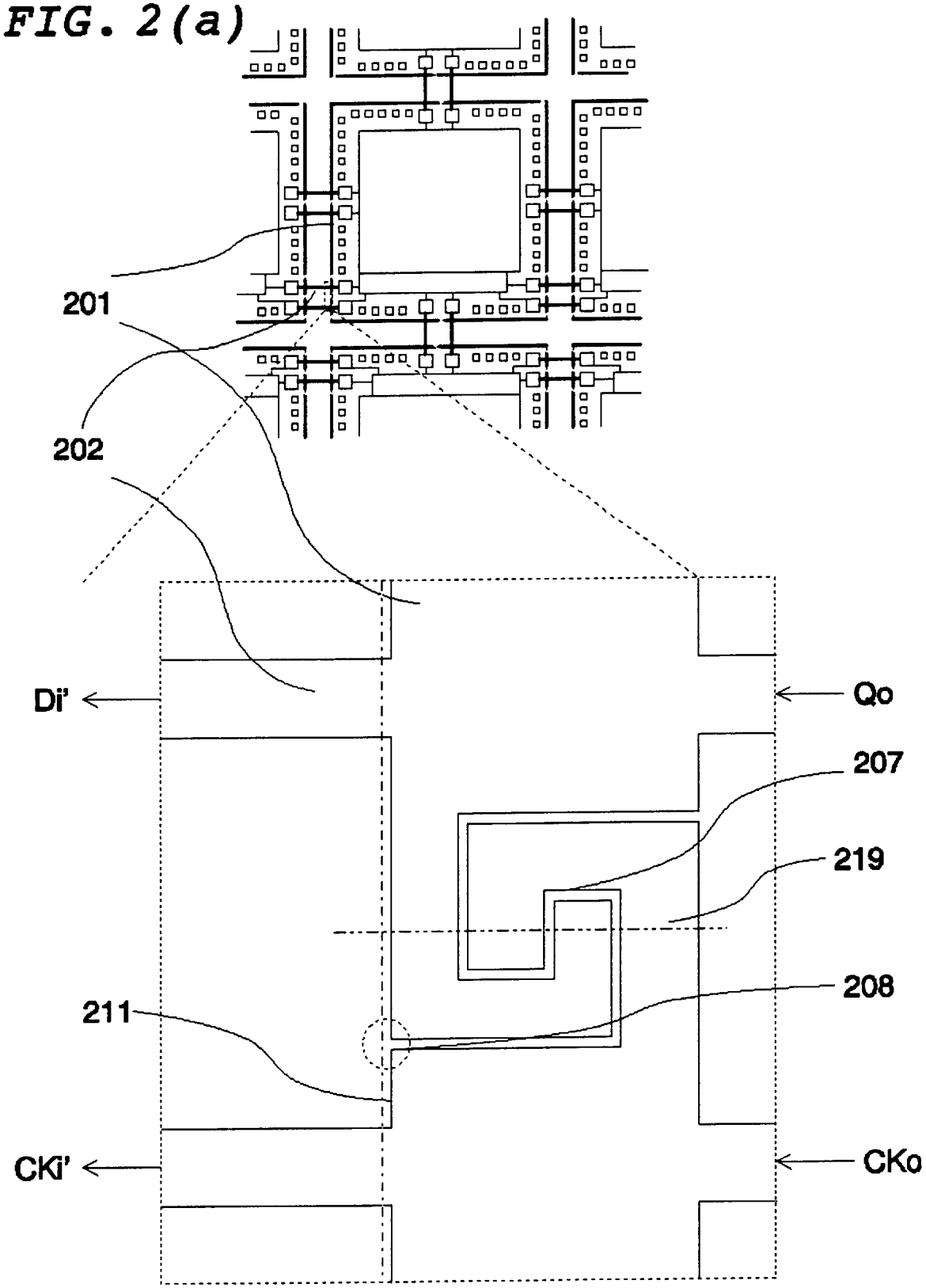

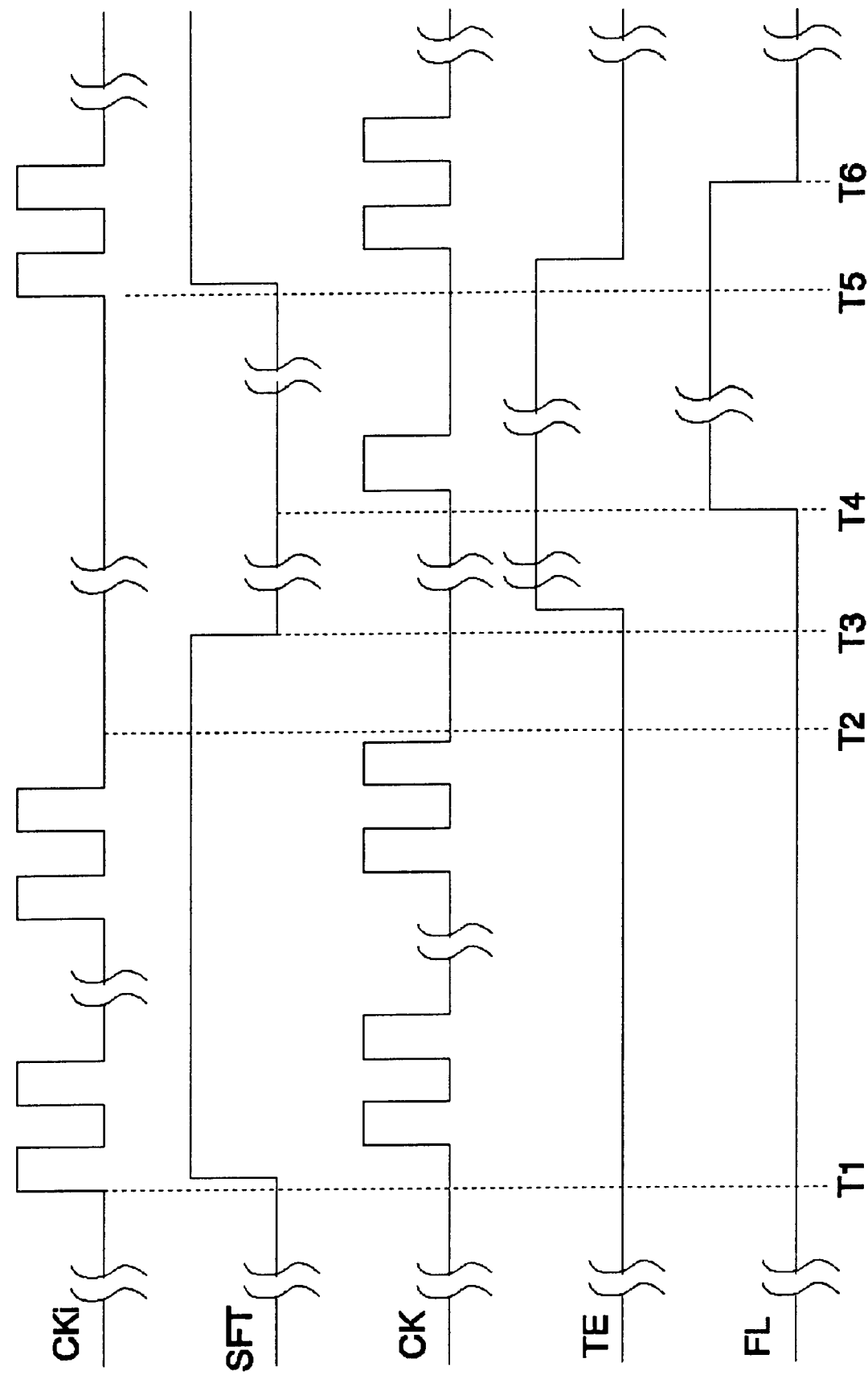

INTER-DICE WAFER LEVEL SIGNAL TRANSFER METHODS FOR INTEGRATED CIRCUITS

BACKGROUND OF THE INVENTION

The present invention relates to signal transfer methods to support parallel processing in a large number of integrated circuits, and particularly to methods to support wafer level testing or wafer level calculations of integrated circuits.

Current art integrated circuit (IC) fabrication techniques involve formation of a plurality of individual IC devices on a single semiconductor substrate, termed a "wafer". After fabrication is completed, the wafer is scribed to separate the individual IC devices called "dice". Usually the individual dice are spaced apart from one another on the wafer to accommodate the scribing tool used to cut the wafer. The wafer thus has the appearance of a series of IC dice separated by intersecting lines to accommodate the scribing operation. These lines are commonly referred to as "scribing lanes". For cost saving purpose, it is desirable to test the dice while they are still in wafer form (called "wafer level testing"). The major difficulty for wafer level testing is the need to establish connections between the tester and the input or output (I/O) signals in each die. Typically, wafer level testing is performed by placing a series of probe needles in contact with bonding pads that are formed on an exposed metal surface of each IC die. These bonding pads are also used to connect elements of a lead frame if the IC die is subsequently packaged. An expensive stepping device moves the probe needles to connect different dice for a tester to test them one by one. Defective dice are marked with ink after they failed such wafer level tests. Unfortunately, individual dice that have passed wafer level tests may still fail in later continuous operation due to reliability problems. A common practice in the IC industry to detect reliability problems is called "burn-in". During burn-in tests, IC devices are exercised at elevated temperature and elevated power supply voltage. It is known that IC dice pass these burn-in tests are highly reliable in practical operation conditions. Conventional burn-in tests are usually done after the IC dice are packaged because of the difficulty in using probe stepping devices in those harsh burn-in conditions.

It is desirable to avoid using a costly stepping probe tester for wafer level tests. It is even more desirable to do burn-in tests at wafer level. The major obstacle for wafer level testing is the difficulty to transfer data between the tester and the individual dice on a wafer. One method is to use a probing device that provides all necessary connections to all the dice on a wafer. Such probing device would have thousands of probe needles and metal lines. It is not practical to build such complex probing devices. Another approach is to transfer testing data into and out of each die through conductive lines patterned on the wafer. This approach is also very difficult. The insulator materials used to separate conductor layers in IC (called interlayer dielectric) have a strong tendency to absorb water moisture, which is known to cause reliability problems. It is a common practice to cover the wafer with a layer of water-resist thin film. This water-resist layer can be destroyed during wafer scribing so that moisture still can penetrate through the exposed edges of scribed dice. A common solution to this problem is to build a continuous metal wall (called "seal ring") between internal circuits and scribing lanes. Combination of the seal ring and the water-resist layer provides a complete water-resist shield for scribed dice. In the mean time, the seal ring also becomes a barrier for all conducting layers used in normal IC fabrication procedures. It is therefore necessary to use additional procedures to deposit wafer level connection lines after all normal IC fabrication procedures have been done. One example of such approach was proposed in U.S. Pat. No. 5,053,900 to W. Parrish. This patent describes the formation of multiple conductive lines along the scribing lanes of a wafer after normal IC fabrication processes are done. These conductive lines connect enlarged I/O pads at the edges of the wafer with suitable multiplexing circuitry formed in an otherwise unused circuit of the wafer. The conductive lines connect the I/O pads of the individual IC dice to the multiplexing circuitry. Wafer level testing is then performed by placing a single set of test probes in contact with a set of enlarged I/O pads associated with the multiplexing circuitry. The multiplexing circuitry selectively connects the test probes with the individual IC dice to be tested through the wafer level conductive lines. These conductive lines would be destroyed by the subsequent die scribing processes. Because there are a large amount of metal in the scribing lane, some of the I/O pads of the individual IC dice may be electrically shorted after the scribing process. Slivers of conductive materials may remain in proximity to sensitive regions of the IC dice. These slivers may interfere with subsequent bonding operations by shorting an IC die with unintended conductive bridges between adjacent I/O pads on the die. In U.S. Pat. No. 5,532,174, Corrigan describes a method to solve the problems caused by scribed metal lines. Corrigan provides the wafer level conductive lines using a sacrificial conductive layer that is removed from the wafer by etching before the scribing process. To facilitate its removal, this conductive layer is formed from a conductive material differing from the conductive material employed to form the I/O pads of the IC dice. Another approach is described in U.S. Pat. No. 5,399,505 to Dasse et al. Wafer level connections are formed after normal IC fabrication procedures to connect probe points to the bonding pads of a plurality of IC dice. External probe needles connected to those probe points provide testing connections to test a plurality of dice, while the bonding pads in each die remain ready for subsequent bonding processes. In U.S. Pat. No. 5,593,903 Beckenbaugh et al. describe methods to deposit multiple layers of metals and insulators on semiconductor wafers after normal IC fabrications are done. The wafer conductors are electrically coupled to bonding pads on each of a plurality of IC die on the wafer at a first end and to wafer test pads at the periphery of the wafer at the second end. Thus, the wafer conductors, wafer test pads and contact pads allow each integrated circuit die to be accessed individually for electrical testing. When all the testing conductors are removed after testing, the bonding pads of each IC die are returned to the same condition they had prior to the formation of the testing conductors. All of the above inventions require additional manufacture procedures to build wafer level connections. These additional procedures increase manufacture cost. They also introduce additional yield loss. These wafer level conductive lines need to connect the bonding pads in all IC dice on a wafer. The most popular wafer size for the current art IC technologies is 8 inches, and the industry is moving into 12-inch wafer. There are thousands of dice in each current art wafer. The wafer level connections will need to use thousands of 8-inch or 12-inch long lines to connect all dice on each wafer. These conductive lines occupy a large area on the wafer. It is therefore likely to cause additional yield loss at subsequent scribing process. The etching processes to remove testing conductor lines are equally likely to cause additional yield loss. Due to the resistance-capacitance propagation delays (RC delays)

of those large area testing lines, it is very difficult to do high frequency tests using such large area conductive lines. All of those inventions provide testing methods to test one die at a time. Those inventions provide little improvement in testing time while testing time is usually the dominating factor that defines testing cost. All the above methods are useful only for wafer level tests or burn-in tests; they are not supporting the actual applications of the IC products.

It is therefore highly desirable to provide wafer level data transfer methods using a small number of small area conductive lines. It is also desirable to support parallel testing so that a large number of dice can be tested simultaneously. Testing time, and therefore testing cost, can be reduced significantly. The wafer level data transfer methods are not only useful for testing purpose. It is even more desirable to provide extremely powerful parallel processing IC products using wafer level connections.

SUMMARY OF THE INVENTION

The primary objective of the present invention is to provide an effective data transfer method to support parallel operations in a large number of IC dice. One objective of this invention is to simplify the connections to support wafer level tests. The other objective is to test a large number of dice in parallel to reduce testing cost. Another important objective of the present invention is to provide the flexibility to avoid defective circuits. Yet another objective is to provide wafer level connections without using additional fabrication processes. The other primary objective of this invention is to build multiple dice integrated circuits to achieve unprecedented performance. These and other objectives of the present invention are achieved by inter-dice data transfer methods of the present invention. Each individual die of the present invention contains internal circuits to control data transfer to nearby dice. Wafer level data transfer is achieved by a series of inter-dice data transfers. The distance between the drivers and the receivers of inter-dice data transfer circuits of the present invention is very short. It is therefore possible to use a small number of small area wafer level conductive lines to support wafer level parallel processing activities. The metal lines in the scribing lane can be short and narrow. They are unlikely to cause electrical shorts during scribing process. External connections are provides by short conductive lines at the peripherals of a wafer. It is often possible to use a small number of external signals to control parallel processing for thousands of dice. The control logic in each die also can be programmed to avoid defective circuits in the wafer. It is therefore possible to build an IC containing many dice with excellent yields.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 2(a) is a top view of the seal ring structures of the present invention;

FIG. 3(b) shows the waveforms for critical timing control signals of the internal testing circuits in FIG. 3(a);

DETAILED DESCRIPTION OF THE INVENTION

The present invention can be used for extremely powerful and complex applications. To demonstrate these complex applications, we start with simpler examples familiar to the current art. More and more complex examples are introduced until the full capability of the present invention is demonstrated. It should be understood that these particular examples are for demonstration only and are not intended as a limitation on the present invention.

Figure 1:
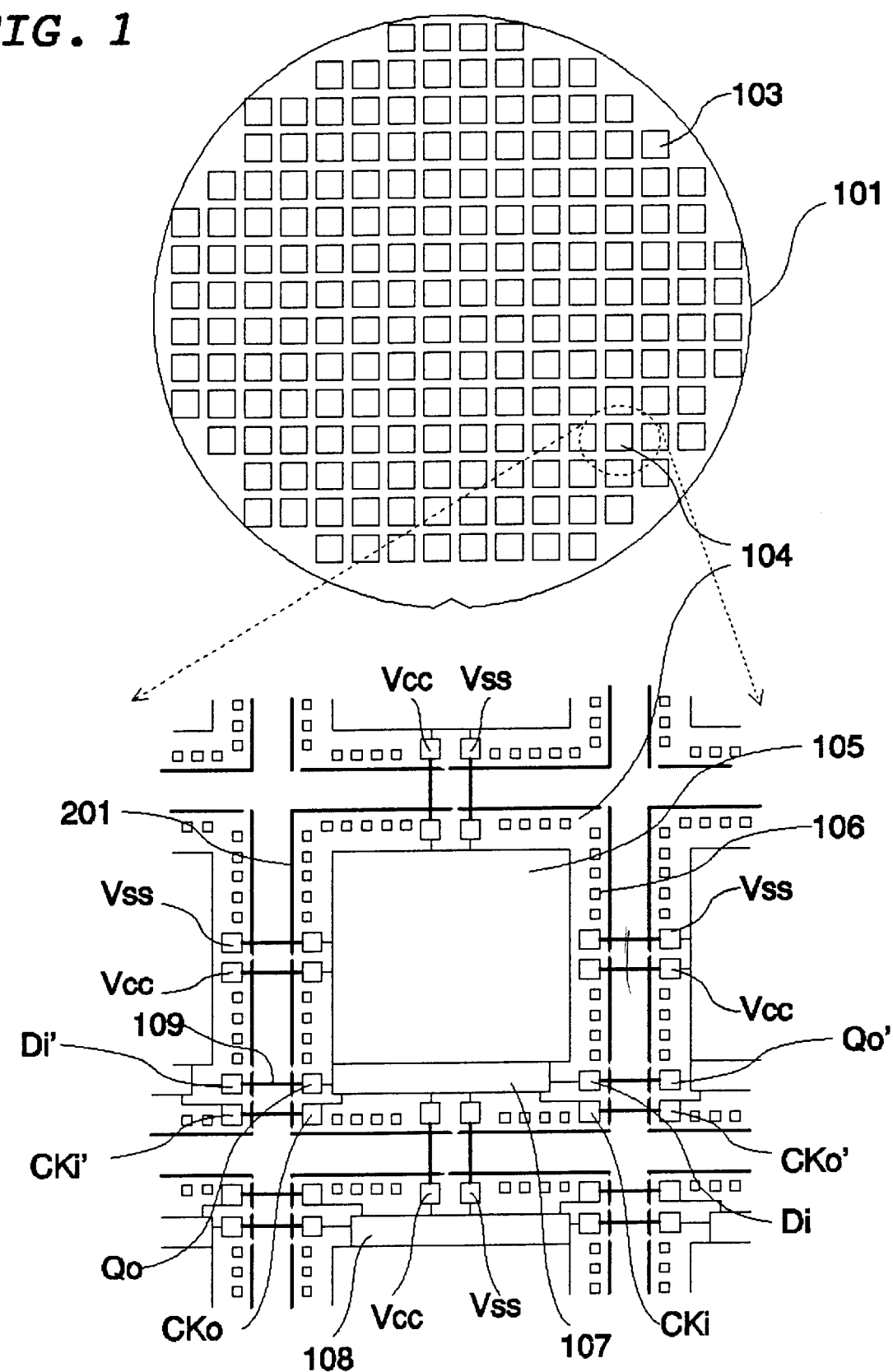
FIG. 1 shows the physical structures for one example of the wafer level connections of the present invention.

FIG. 1 illustrates the wafer-level connections in a semiconductor wafer (101) of the present invention. This wafer (101) contains a plurality of integrated circuit dice (103, 104) that are represented by rectangles. One of the circuit die (104) is magnified to reveal more details as shown in the lower diagram of FIG. 1. Each die contains core circuits (105), testing circuitry (107), and a plurality of bonding pads (106). The core circuits (105) support desired applications of the IC. The testing circuitry (107) executes tests to make sure the IC is free of error. The bonding pads (106) provide contact points for input/output (I/O) signals for the die. A few of those bonding pads (Vss, Vcc, Di, Qo, Cko, Cki) are also used for inter-dice connections. The power supply pads (Vcc) in each die are connected to those in nearby dice as shown in FIG. 1. In this way, the power lines of all the dice in the wafer (101) are all connected to form a continuous power network. The ground pads (Vss) in each die are also connected to those in nearby dice. Ground lines of all the dice in the wafer (101) are also connected to form a continuous network. All the dice in the same row are identical integrated circuits with the same orientation. The test circuits (107) in each die have one data input pad (Di), one data output pad (Qo), one clock input pad (CKi) and one clock output pad (CKo). The data input pad (Di) of each die is connected to the data output pad of previous die (Qo'), while the data output pad (Qo) of each die is connected to the data input pad of the next die (Di') so that the testing data paths of all the dice in the same row are connected in series. The clock input pad (CKi) is connected to the clock output pad of previous die (CKo'), while the clock output pad (CKo) is connected to the clock input pad of the next die (CKi') so that the testing clock of all the dice in the same row are connected in series. All the dice in nearby rows are rotated by 180 degrees. Therefore, the data path and the clock path of the testing circuits in nearby rows (108) propagates in opposite directions, which allows us to connect all the testing circuits (107,108) in the wafer in series.

Figure 2B:
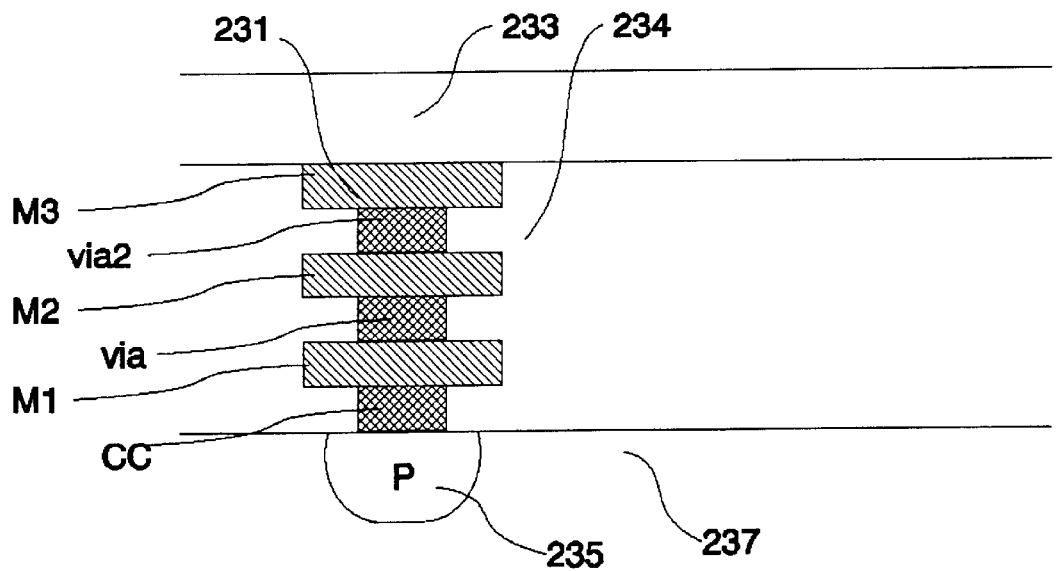
FIG. 2(b) is a cross section diagram of a prior art seal ring.
Figure 2C:
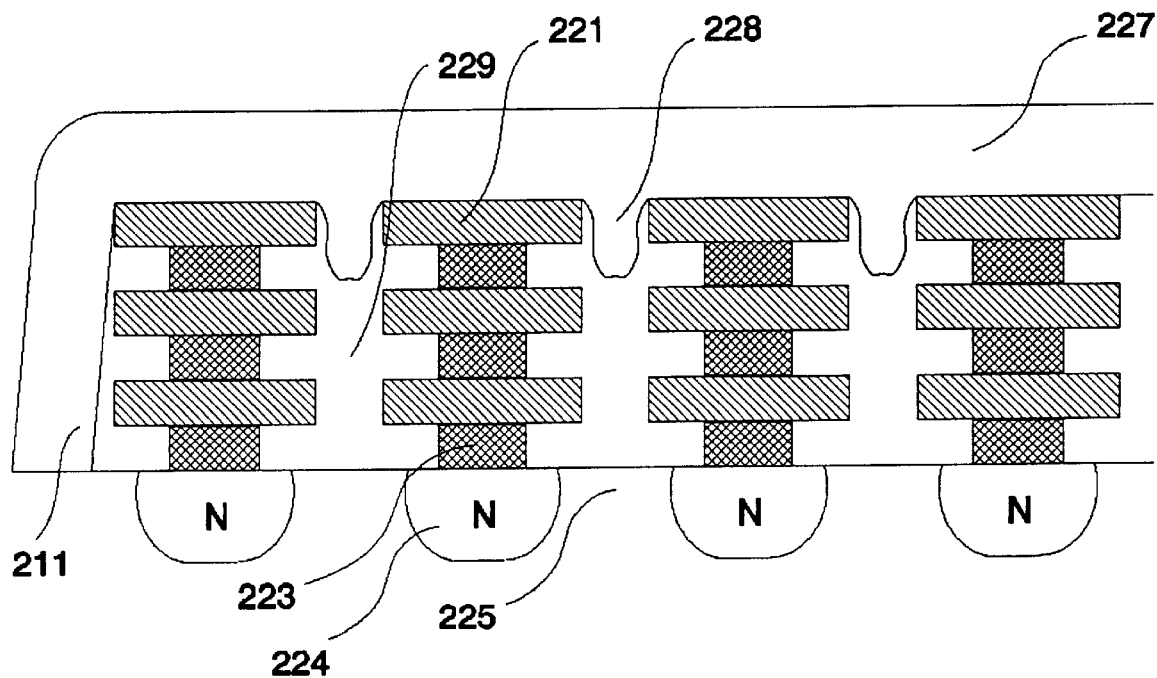
FIG. 2(c) is the cross section diagram of the seal ring in FIG. 2(a)

To prevent moisture induced reliability problems, the outside boundaries of all the IC dice (103, 104) are surrounded by continuous metal walls (201) called "seal ring", which is represented by bold lines at the outside boundaries of each die in FIG. 1 and in FIG. 2(a). FIG. 2(b) shows the cross-section diagram of a prior art seal ring. At the edge of the seal ring there is a metal wall (231) that is made of all the metal layers (M3, M2, M1), inter-metal contacts (via2, via), and diffusion contacts (CC). The diffusion contacts (CC) are connected to p-type diffusion (235) so that the metal wall (231) is shorted to the p-type semiconductor substrate (237). A water-resist insulator layer (233) is deposited on top of the top layer metal (M3) and interlayer dielectric materials (234). This water-resist insulator layer (233) and the metal wall (231) form a complete shield to prevent moisture penetration into the IC. This prior art seal ring is a barrier for wafer level connections because none of the available metal layer (M1–M3) can pass through this metal wall (231) without being shorted to the substrate (237). There are several ways to overcome this problem. The first method is to use an external probe card to make the wafer level connections. This probe card needs to have thousands of metal probes to make the connections to all or part of the dice on the wafer. Such probe card is very difficult to manufacture. The second method is to use additional metal layers deposited on top of the water resist insulator layer (233) to make the wafer level connections after normal IC fabrication processes are all finished. This method is practical, but it introduces additional manufacture cost by adding more metal layers and more lithographic masks to define the wafer level metal connections. A method to make wafer level connections using existing manufacture procedures without increase in manufacture cost is described in FIGS. 2(a,c). FIG. 2(a) shows the top view of a seal ring (201) of the present invention. This seal ring (201) is broken into sections. Each inter-dice connection line (202) is connected to one section of the seal ring before it passes through the boundary to next die. The metal walls in these seal rings no longer form a continuous metal wall at the boundaries between different sections of the seal ring. Two methods are implemented to prevent moisture penetration at the seal ring section boundary (207). The first method is to make the boundary a winding narrow path (207) as shown by the magnified top view in FIG. 2(a). The second method is to fill the outside edge (211) of the seal ring with water-resist insulator layer. The structure of the seal ring is further illustrated by the cross section diagram shown in FIG. 2(c). This cross-section is taken at the location (219) marked by a double dash line in FIG. 2(a). At that location, we have four closely spaced metal walls (221). Those metal walls (221) have the same structures as the prior art metal wall (231) shown in FIG. 2(b) except that their diffusion contacts (223) are connected to n-type diffusion layers (224) in the p-type substrate (225). These metal walls (221) are therefore not shorted to the substrate (225). A water-resist insulator layer (227) covers not only the top but also the outside edge (211) of the seal ring; it also fills into part of the space (228) between those metal walls (221). Referring back to the top view in FIG. 2(a), the outside opening (208) of the seal ring section boundary (207) is sealed with water-resist insulator layer (227). Even if some moisture penetrates through this opening (208), the moisture must travel through a long, narrow, winding path (207) before it can reach internal circuits. Using the methods described in FIGS. 2(a,c), we can separate the seal ring (201) into a plurality of unconnected sections without causing moisture induced reliability problems. Wafer level connections between different dice (202) can therefore pass through the seal ring (201) using existing metal layers (M1–M3) in the IC manufacture technology.

Figure 3A:
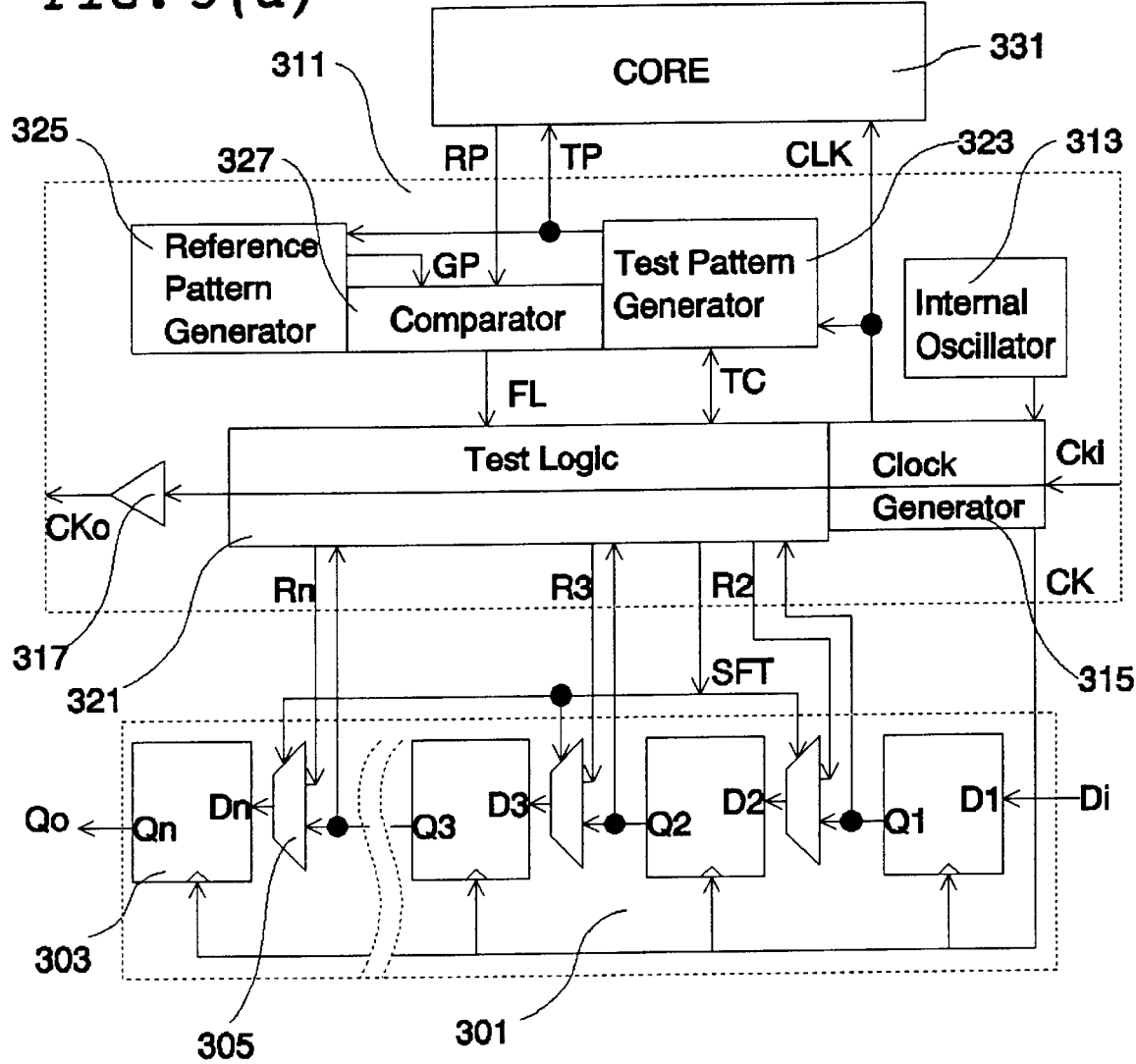
FIG. 3(a) shows the schematic diagram for internal testing circuits of the present invention.

The above wafer level connections allow us to link testing circuitry (107, 108) in different dice using a few small metal lines (202). Each inter-dice metal line is typically less than 0.1 mm long, and it is typical a few $\mu$m wide. These small metal lines (202) are unlikely to cause shorts after scribing processes. The testing circuitry (107,108) in each die of the wafer in FIG. 1 are used to transfer data and to execute built-in-self-test (BIST). The block diagram for one example of the test circuitry is shown in FIG. 3(a). The test circuitry contains a scan chain (301) that has a plurality of flip-flops (303) and multiplexers (305). The test data input (Di) is connected to the data input of the first flip-flop (D1). Those multiplexers (305) are controlled by a control signal SFT. When SFT is high, the data output of the first flip-flop (Q1) is sent to the data input of the second flip-flop (D2), the data output of the second flip-flop (Q2) is sent to the data input of the third flip-flop (D3), . . . , the data output of the second to last flip-flop is sent to the data input of the last flip-flop (Dn), so that the scan chain (301) becomes a shift register; at the rising edge of the scan chain clock control signal (CK), the output of each flip-flop shifts to the output of the next flip-flop. When SFT is low, internal signal R2 is sent to the data input of the second flip-flop (D2), internal signal R3 is sent to the data input of the second flip-flop (D3), . . . , internal signal Rn is sent to the data input of the last flip-flop (Dn), so that the scan chain (301) becomes a parallel register; at the rising edge of the scan chain clock control signal (CK), input signals (Di, R2, R3, . . . , Rn) are latched by the flip-flops simultaneously. The outputs of the flip-flops in the scan chain (Q1, Q2, . . . , Qn) are sent to a test logic circuit (321). This test logic circuit (321) sends and receives control signals (TC) to and from a test pattern generator (323). This test pattern generator (323) generates test vectors (TP) to the core circuit (331) of the IC to execute BIST. The test vectors (TP) are also sent to a reference pattern generator (325) that provides the "correct vectors" (GP) to a comparator (327). The comparator (327) compares the output signals (RP) from the core circuit (331) with the correct vectors (GP), and flags a failure signal (FL) if an error is detected. The failure signal (FL) is sent back to the test logic (321) to start an error handling procedure described in FIG. 3(b). The timing controls of all the above circuits are defined by a clock generator (315). This clock generator (315) takes the output of an internal oscillator (313) to generate a high frequency internal clock signal (CLK) to control the timing of testing circuits (323, 325, 327) and core circuits (331). The frequency and the shape of CLK can be determined by test control signals (TC, Q1–Qn). The clock generator (315) also takes the test clock input (CKi) to generate the scan chain clock signal (CK). The test clock input signal (CKi) is duplicated by a buffer (317) to generate test clock output signal (CKo) to the next die. The scan chain clock (CK) is also determined by the failure signals (FL) and other test control signals (TC, Q1–Qn).

FIG. 3(b) shows timing relationships between critical control signals (CKi, SFT, CK, TE, FL) of the test circuitry (107, 108). The signal TE is a test enable signal generated by the test logic (321) that activates BIST. This TE signal is turned on when shift signal (SFT) indicates end of scan chain shift operations and when the scan chain outputs (Q1–Qn) signals the need for BIST. Initially, all the control signals stay at ground voltage. At time T1 time in FIG. 3(b), the test logic (321) senses the first rising edge of the test clock input (CKi), and activates the shift signal (SFT). The clock generator (315) generates scan chain clock signal (CK) to shift the data in the scan chain (301). At time T2, CKi is deactivated, indicating all the test control data (Q1–Qn) have been shifted to the right positions. The test logic (321) waits for a time longer than the period of CKi, and deactivates SFT at T3 when it is sure that there is no more scan chain shifting activities. If the scan chain outputs (Q1–Qn) request self tests, the test enable signal TE is activated to start BIST shortly after SFT is deactivated. The core circuit (331) is exercised by the test pattern generator (323) at a frequency determined by the internal clock (CLK). When an error is detected by the comparator (327) at T4, failure flag FL is activated, and a pulse is sent to CK to latch an output vector (R2–Rn) into the scan chain (301). This error handling procedure allows us to store error data into the scan chain; it also allow us to change the testing sequence to obtain more data. At time T5, CKi is activated indicating a new scan chain data shifting activity just started. TE is deactivated to stop BIST. After the final failure factors (R2–Rn) is properly latched, the failure flag (FL) is deactivated at time T6. Scan chain clock CK is activated to shift test results out to the scan chain output pad (Qo) while receiving new test control parameters through the scan chain input pad (Di).

The above scan chain testing methods are known to the art of IC design. There are many other testing circuits available to support wafer level testing of the present invention. It should be understood that the particular testing circuits described in the above section are for demonstration only and are not intended as a limitation on the present invention. The novel structure of the present invention is the data transfer mechanism between nearby dice. This linkage between the data transfer circuits in nearby dice forms a serial wafer level data transfer mechanism (202). This wafer level data transfer method requires minimum wafer level connections. Using two signals, we can shift test control parameters into all the connected dice to start high frequency operations in parallel, and shift testing results out of them using low frequency scan chain signals.

Figure 4A:
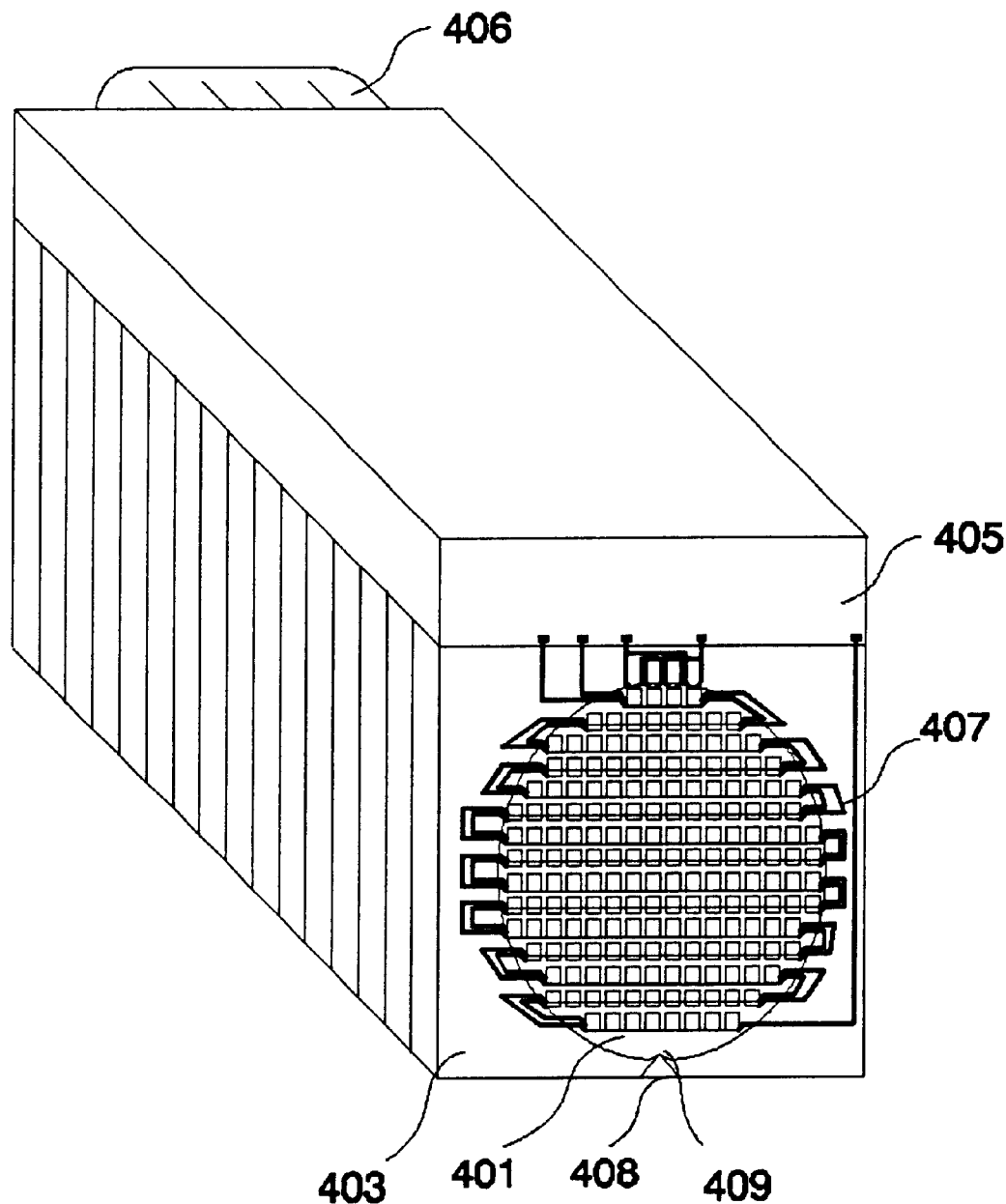
FIG. 4(a) illustrates a wafer box supporting simultaneous testing of all the dice in 16 wafers.
Figure 4B:
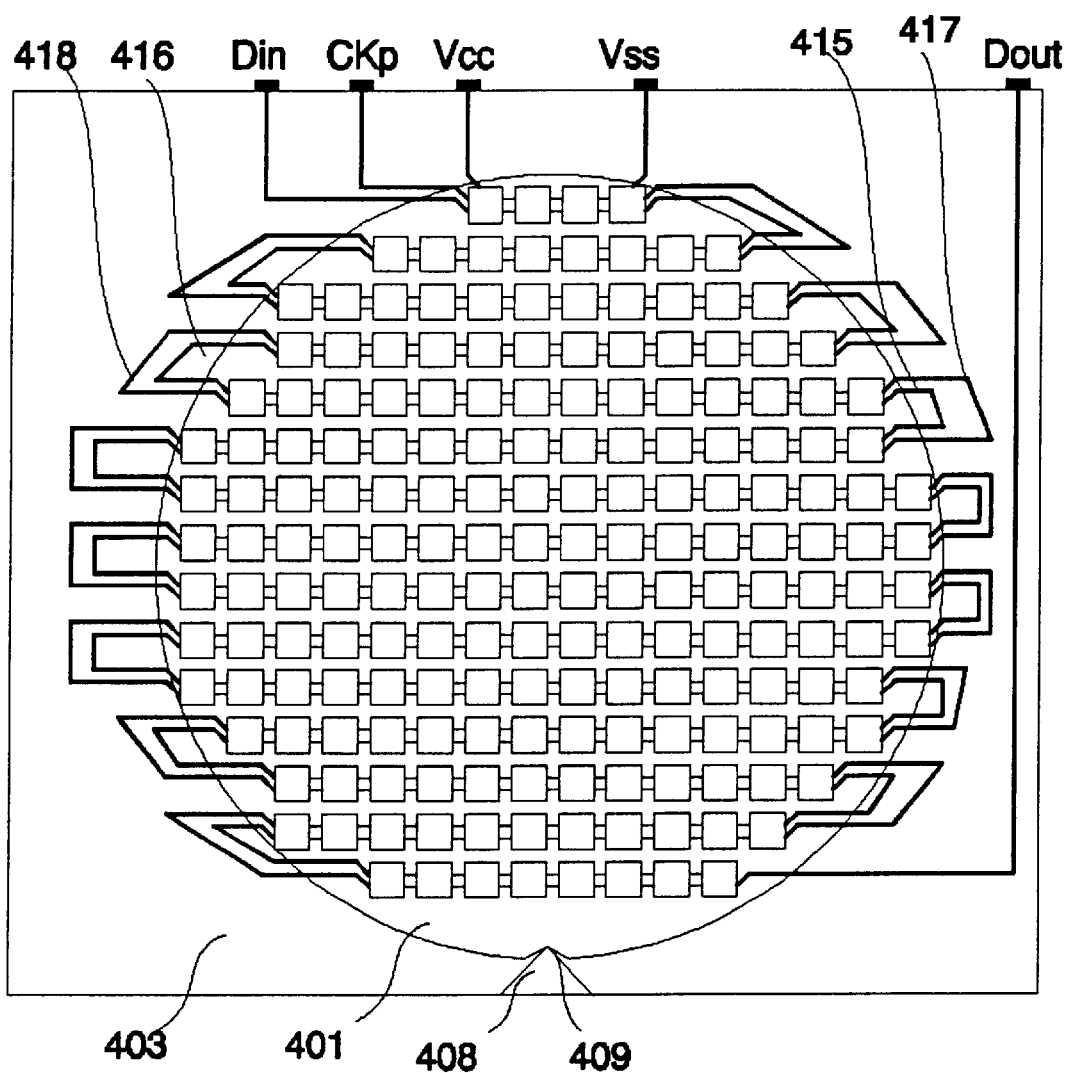
FIG. 4(b) shows the side view of wafer level connections for one of the probe box in FIG. 4(a)
Figure 4C:
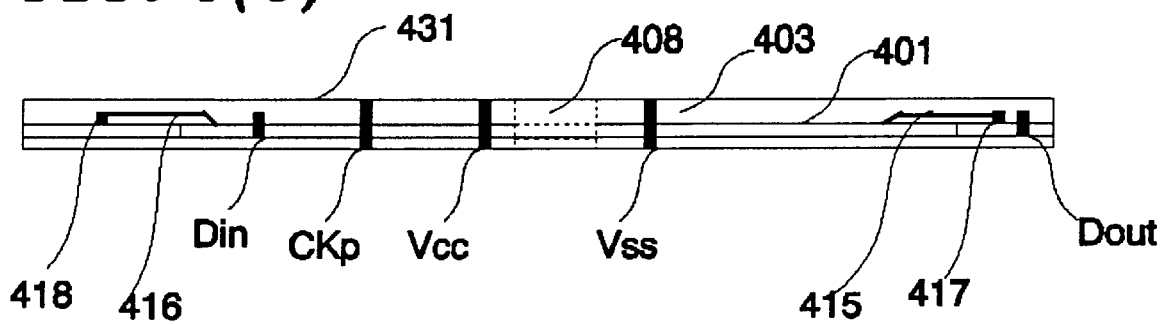
FIG. 4(c) shows the top view of one of the probe box in FIG. 4(a)

In our examples, scan chains are linked together by rows. It should be understood that this particular linking method is for demonstration only and is not intended as a limitation on the present invention. There are many other ways to link the scan chains—linking by columns, linking diagonally, linking the whole wafer, or linking multiple wafers. FIG. 4(a) shows a test assembly for simultaneous wafer level tests on many wafers. Each wafer (401) is mounted on a probe box (403). There are 16 wafers mounted in 16 probe boxes in this example. The wafer orientation is defined by a wedge (408) fits against the wedge (409) at the bottom of the wafer (401). These probe boxes (403) provide probing connections 407 that links wafer level connections to system level connections through a cable box (405). High level accesses are provided by a cable connection port (406) at the back of the cable box (405). FIG. 4(b) shows the front view of the probe box (403), and FIG. 4(c) shows its top view. Based on the structures described in FIG. 1, the power supply (Vcc) lines and the ground lines (Vss) for all the dice in the wafer (401) are already connected together in two dimensional networks; each probe card only need to provide one connection to each power supply network. The scan chains for dice in the same row are already connected by inter-dice connections. The probe box 403 links scan chains at different rows by linking the scan chain data and clock paths using metal probes (415, 416) and metal lines (417, 418) on the probe card. All the scan chains in the wafer (401) are therefore linked together as a big scan chain. The first data input to the big scan chain (Din), the final output of the big scan chain (Dout), and the first scan chain clock signal (CKp) are available at the edge contacts of the probe box. Connections to other wafers are provided by the cable box (405) through those edge contacts (Din, CKp, Vcc, Vss, Dout).

Figure 4D:
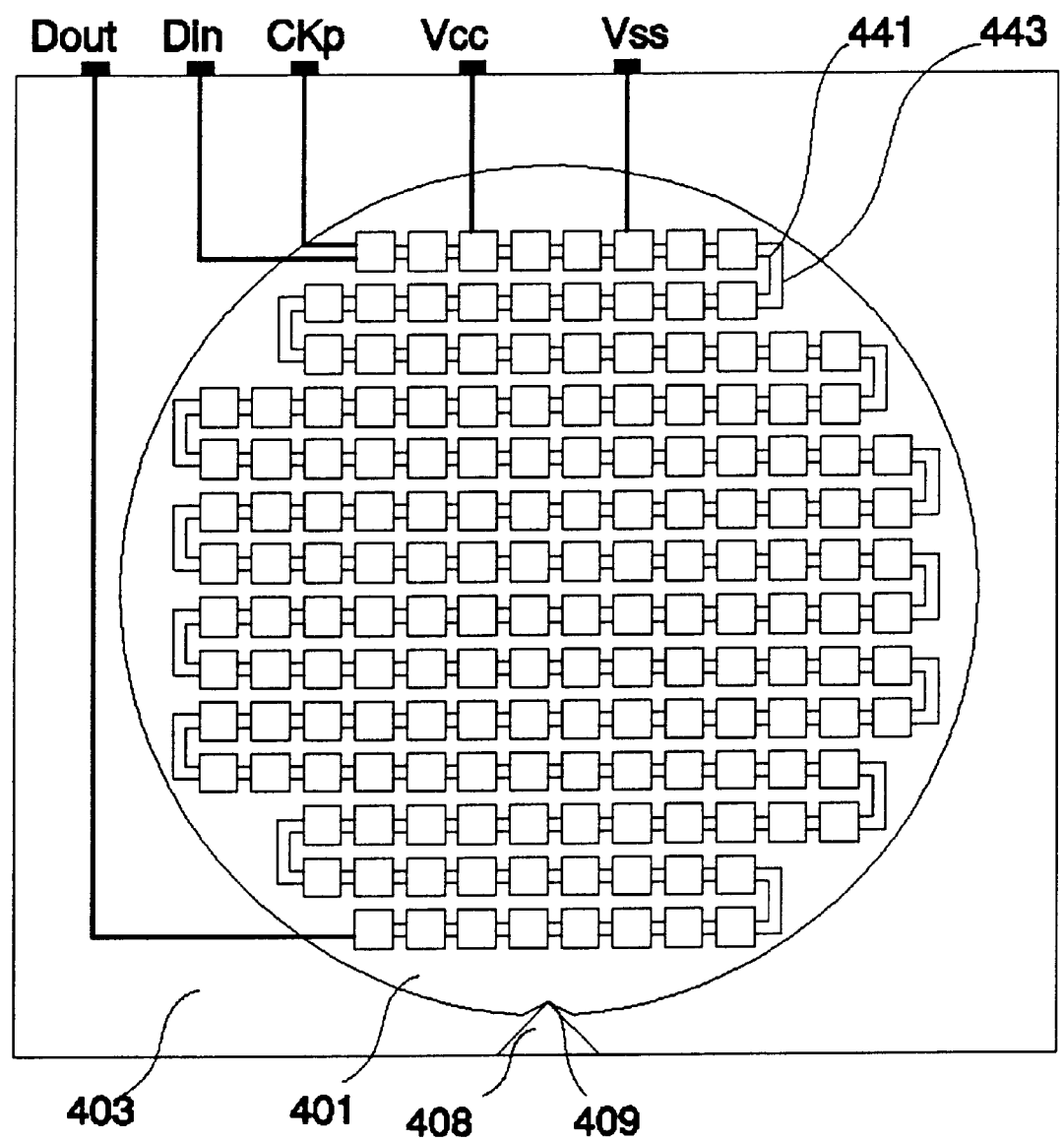
FIG. 4(d) shows another example of the wafer level connections of the present invention.
Figure 4E:
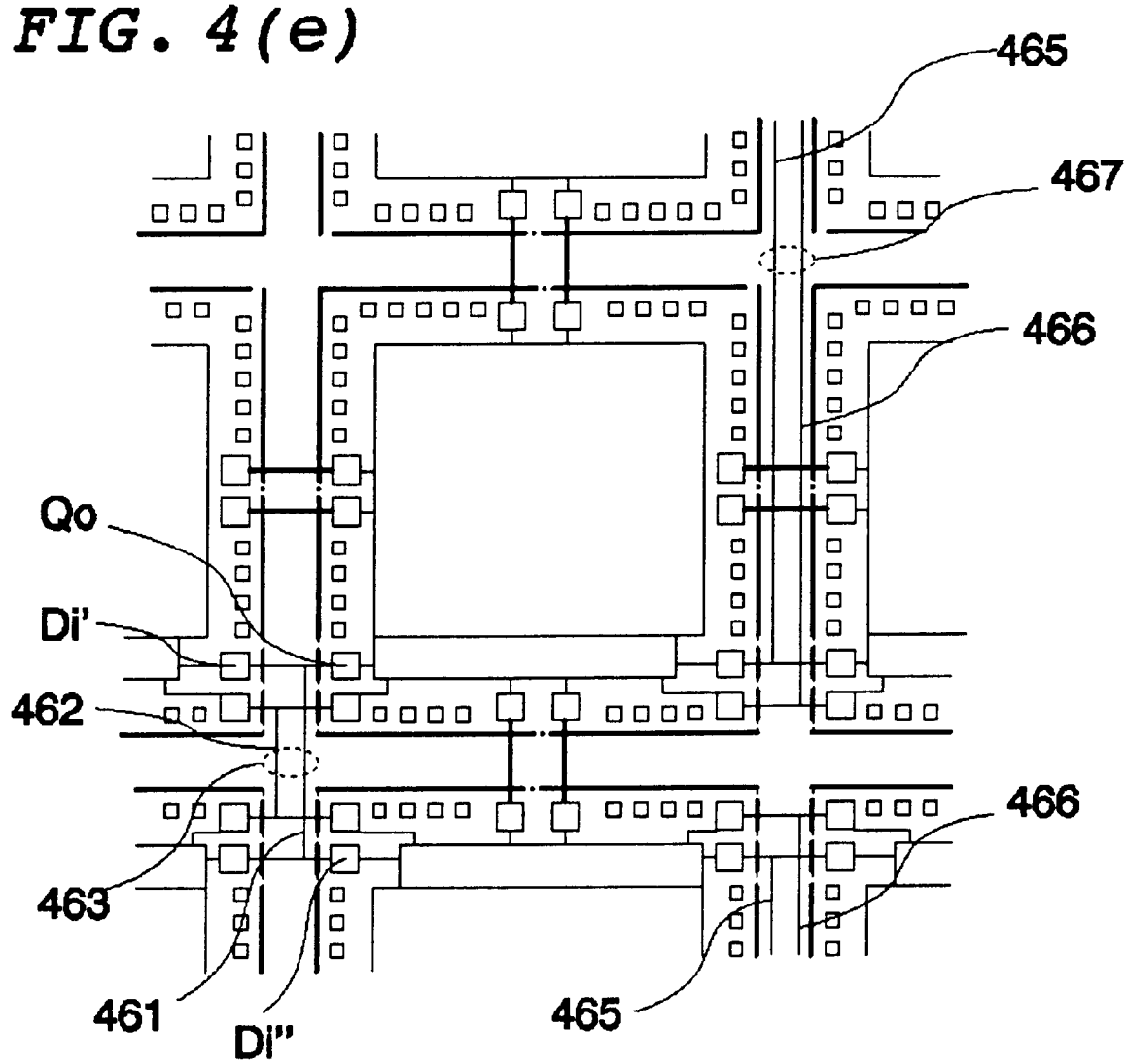
FIG. 4(e) is a magnified diagram revealing another method for wafer level connections of the present invention.
Figure 4F:
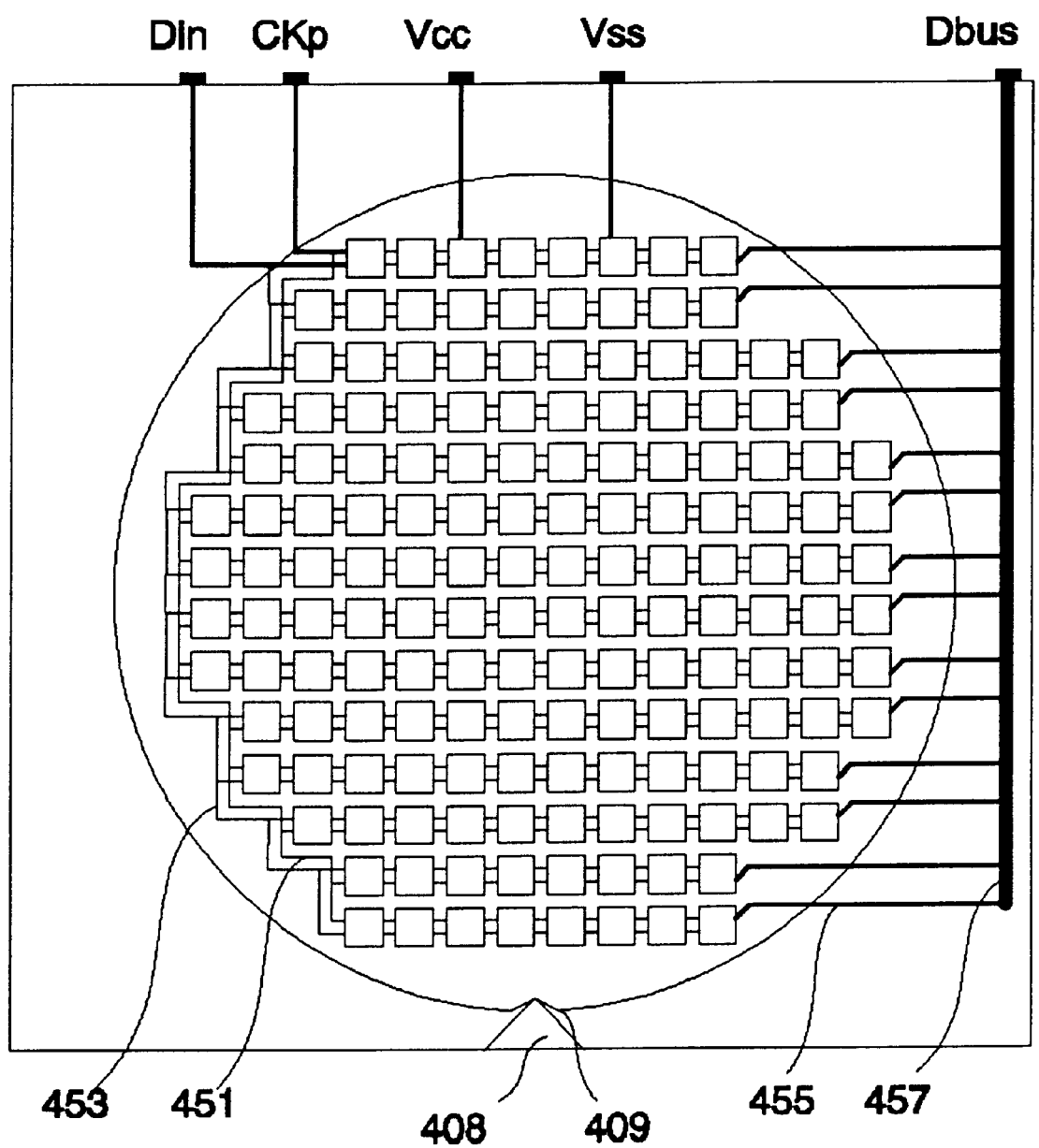
FIG. 4(f) shows one way to shorten test data input/output time.

The probe box described in FIG. 4(b) needs to use 4 probes (415,416) for each row of dice. We will need to build different probe boxes for different products in order to have correct probe connections. It is desirable to use the same probe box for different products. FIG. 4(d) describes one method to reduce the number of probes. The die at the end of each row is replaced by special dice for wafer level connections (441, 443). The scan chains in the wafer are therefore linked without using external probes (415, 416). Each probe box (403) only needs 5 probe needles (Vss, Vcc, CKp, Din, Dout), and it can be used for different products if the locations of the probe are adjustable or if the pads for those 5 signals are placed at the same positions for different products. Replacing end-of-row dice with connection lines (441,443) introduce little yield loss because dice at those locations are mostly defective anyway. The major cost is that we need to provide another mask set for those end-of-row connection dice. FIG. 4(e) shows another method that does not need additional mask set. The scan chain output pad (Qo) of each die is not only connected to the scan chain input pad (Di') of the next die in the same row but also connected to that of the next die in the same column (Di"). Other scan chain I/O signals (Di, CKi, CKo) are also connected to nearby dice in both row and column directions in similar way as shown in FIG. 4(e). The vertical inter-dice connection lines (461, 462, 465, 466) are designed so that they can be cut by laser zapping at zap points (463, 467) in the scribing lanes. Wafer level connections are configured by cutting proper vertical wires. Because all inter-dice wires are defined by the same masks, there is no need to use extra mask sets. This method also provides additional flexibility to configure wafer level connections. One alternative wafer level connection is shown in FIG. 4(f). For this example, the scan chains are connected for every row. The scan chain inputs (Din, CKp) are connected for all end-of-row dice at the left hand side using connection wires (451, 453). We need one probe (455) for each row to collect scan chain output signals; those data are sent by a data bus (457) to a group of edge pads (Dbus). Since each wafer level scan chain is shorter, we will be able to initialize the tests and obtain results from the wafer at faster rate. However, we will need many more output buses (Dbus) and the loads on scan chain inputs (CKp, Din) are much higher.

Figure 4G:
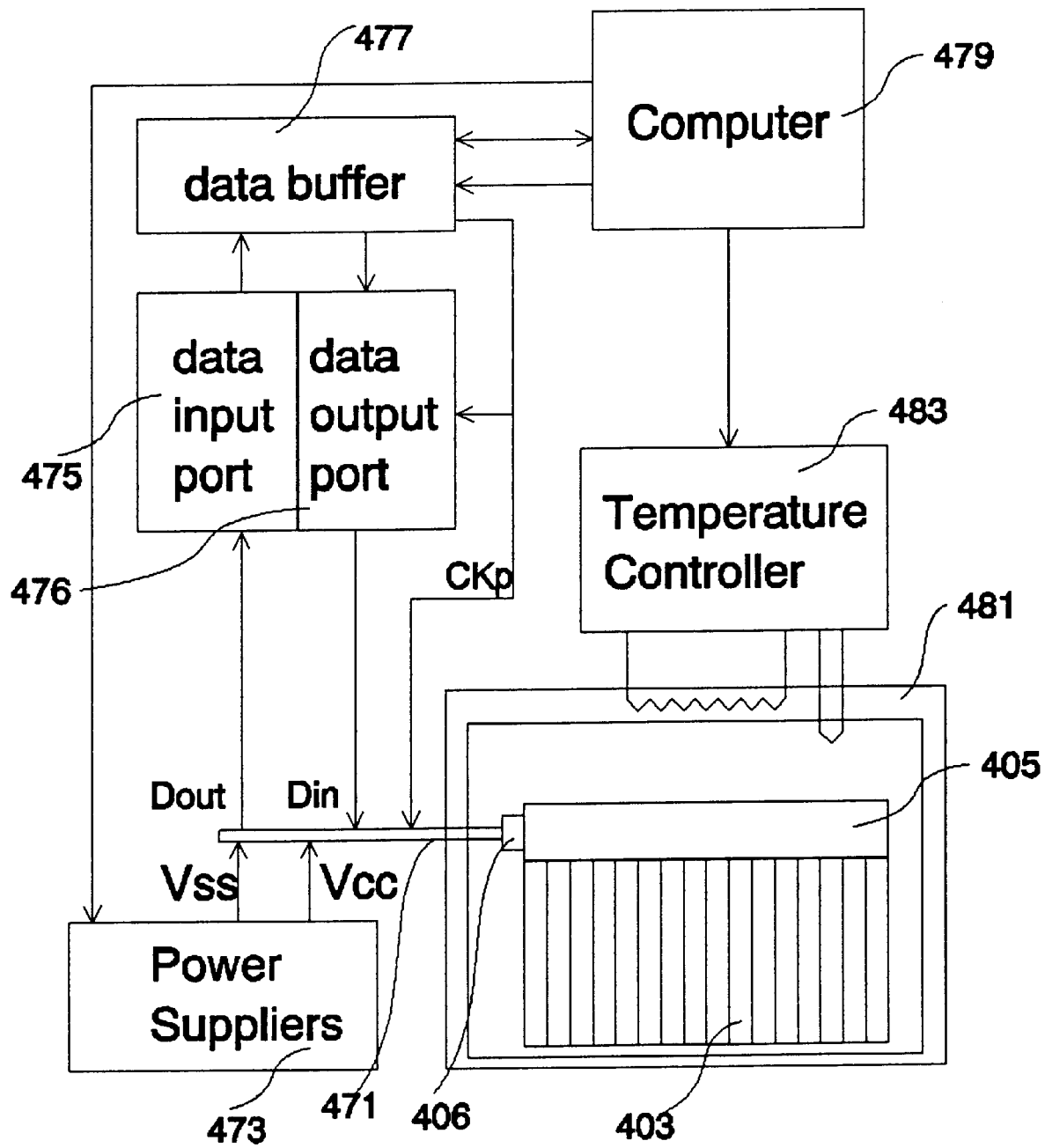
FIG. 4(g) is a block diagram for a testing system of the present invention.

FIG. 4(g) is a block diagram for a testing system of the present invention. Sixteen wafers (403) are placed in an oven (481) to be tested simultaneously. The power and control signals for all 16 wafers are connected by a cable box (405), then brought out of the oven using a cable (471) at the back of the oven. A personal computer (479) controls the testing procedures by sending 16 scan chain input data (Din) to the wafers, and records the testing results provided by 16 scan chain output data (Dout). The same computer controls the testing voltages provided by programmable power suppliers (473). It also controls the testing temperature regulated by a temperature controller (483). In order to provide the data in a uniform rate, the scan chain data are stored in a data buffer (477). This data buffer (477) provides a clock signal (CKp) to define the scan chain data rate. The computer (479) sends bursts of input data to the data buffer (477) in unpredictable rates. When the data buffer (477) stores enough scan chain input data, it starts to shift the data to the wafers (403) through the data output port (476) at a clock rate defined by CKp. In the mean time, the scan chain output data (Dout) received by the data input port (475) are stored into the data buffer (477) at the same rate defined by CKp. These output data are sent back to the computer (479) by the data buffer (477) when the computer data bus is available. This testing system uses common devices available in the electronic industry while its performance is better than the most sophisticated testing systems of current art. The advantages of this testing system are demonstrated by a practical example in the following sections.

The IC product in this example has 1,000 dice in each wafer; each die is equipped with the inter-dice connections described in FIG. 4(e). Only five probes are needed to connect each wafer. The self-test circuits of this product have been described in FIG. 3(a). The BIST mode in each die contains 16 testing programs; each test program has about one million test vectors. The maximum clock rate for this product is 320 MHz. It has an internal oscillator (313) that can be programmed to run tests at 320 MHz for high speed calibration or at 20 MHz for data retention tests. Power consumption for 320 MHz, 3.3 volts operation is around 2 watts, and it is about 0.15 watts for 20 MHz operations.

When BIST is disabled, the oscillator is also disabled, and the power consumption is close to zero. The scan chain in each die contains 32 flip-flops; the functions of scan outputs (Q1–Q32) are described in Table I. Internal self-test mode is enabled only when Q1 is high and when there is no scan chain shift operation. Registers Q6–Q2 are configured as a 5-bit binary counter when the scan chain is not shifting data. When the BIST starts, the test pattern generator (323) executes the first test program according to the initial values of Q5–Q2 defined by previous scan chain shift operation. The binary counter is incremented to start the next test program whenever the IC passes one test program. These procedures are repeated again and again until the next scan chain shift operation is started or until an error is detected. If an error is detected, Q1 is reset to stop BIST, and the failing test conditions are stored into Q26–Q2. Flip-flop outputs Q31 to Q27 are use to control configuration options in the IC. After the scan chains for those 1,000 dice in a wafer are all linked into one big scan chain by laser zapping procedures, the testing capability for the whole wafer could be disabled by a catastrophic failure in one die. Q32 is an important signal that allow us to disable all other circuits in the bad die except the scan chain circuits as a method to avoid the influence of a few bad dice. Q32 can be set by scan chain shift operation or by a simple power-up self test which is executed automatically when the power is turned on. For the case when setting Q32 can not revive the testing chain, we still can avoid bad dice by proper laser zapping.

TABLE I definitions of scan chain register outputs

| register outputs | Function |
| --- | --- |
| Q1 | BIST enable |
| Q2-Q5 | current test program or the first failing test program |
| Q6 | current test frequency or the first failing test frequency 1 for 320 MHz, 0 for 20 MHz |
| Q7-Q26 | the first failing test vector |
| Q27-Q31 | programmable configuration options |
| Q32 | disable everything except the scan chain |

After proper initial calibrations and laser zap configurations, 16 wafers are placed into the testing system illustrated by FIG. 4(g). There are 16,000 dice under test simultaneously. The computer (479) initializes the tests by sending 512 K bits of control signals to those 16,000 dice through 32 K scan chain shift cycles; testing results also can be obtained by the same scan chain shift procedures. Self-tests are executed simultaneously in all the dice once the scan chain shift procedures are done. At 320 MHz, the system can execute 5,120,000,000,000 test vectors per second. However, it is not practical to test all the dice at maximum frequency simultaneously because the peak power will be 32 Kwatts, and the noise in the system will be too high. The solution is to initiate only one out of 17 dice to start on high frequency test programs; the other 16 dice are initiated to start on one of the 16 low frequency testing programs. The 320 MHz tests are executed 16 times faster than the 20 MHz tests. Once the self tests are started, 1/17 of the dice will take turns to do high frequency tests, while all the other dice are doing low frequency tests. In this way, the total test time is the same, while the peak power consumption is reduced to 4 Kwatts. The power consumption is also uniformly distributed in time and in space; system noise is therefore reduced dramatically. The system power can be further reduced by disabling part of the dice using their Q1 control signals. For example, we can test ¼ of the dice at a time to reduce the power to 1 Kwatts, but that will increase testing time by 4 times.

The above example clearly demonstrates that a testing system of the present invention can achieve unprecedented testing efficiency and unprecedented cost efficiency. For functional tests, 32 BIST programs are done on 16,000 dice in less than one second. The locations of the failed dice and their failing vectors are recorded in computer. There is no need to ink the failed dice, and there is no need to use sophisticate stepping devices. The advantages of this test system are even more obvious for reliability burn-in tests. Burn-in stress for all 16,000 dice can be applied simultaneously. Testing is done in-situ; there is no need to stop burn-in for testing purpose. The computer records the time, the location, and the failing vector for every reliability failure. Testing costs and burn-in costs become negligible for IC products using the present invention.

Figure 5:
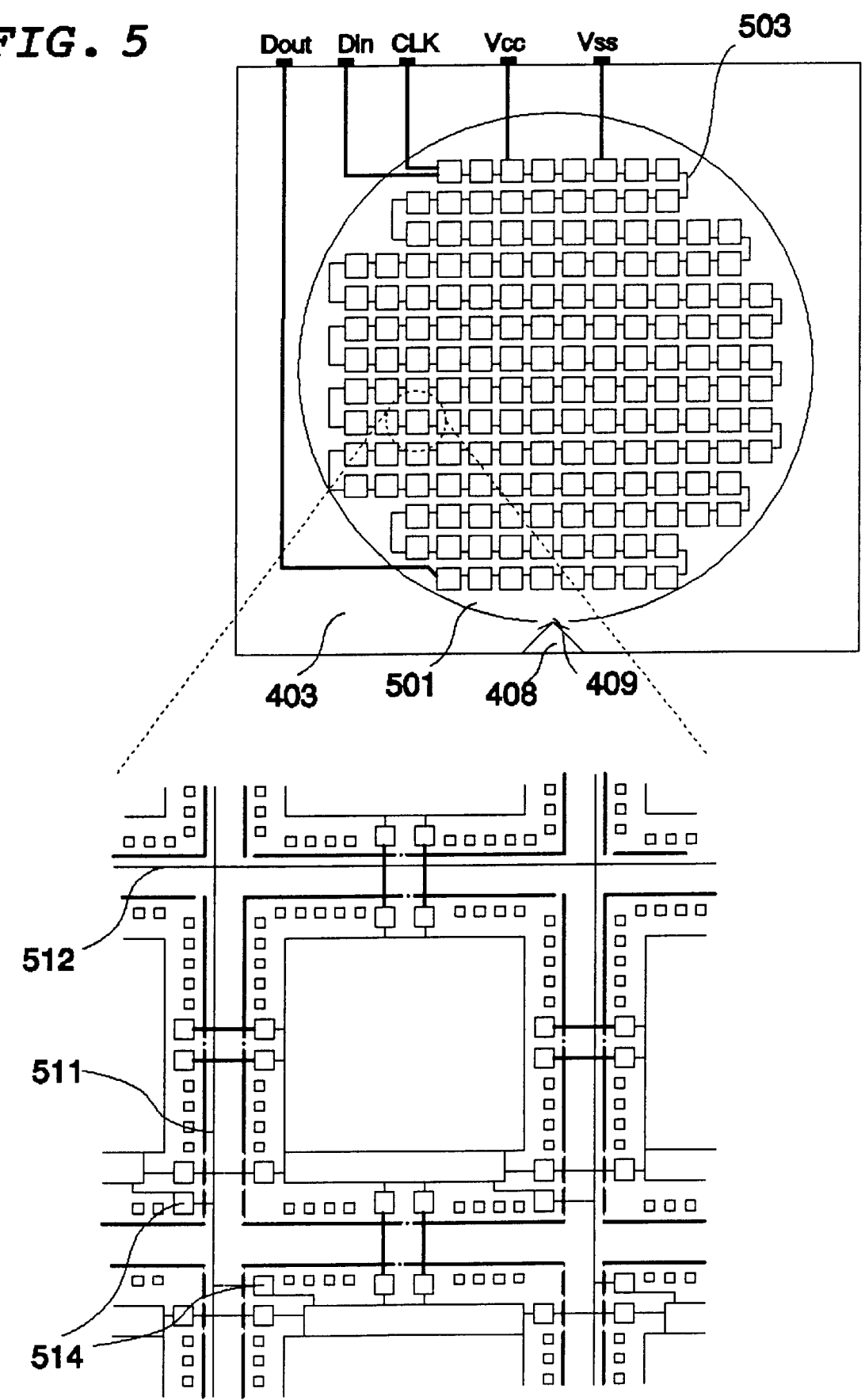
FIG. 5 illustrates a two-dimensional wafer level clock network.

In the above examples, the scan chain clock input signal (CKi) in each die is duplicated by an internal buffer (317) before the signal (CKo) is sent to the next die. Buffering the scan chain clock (CKi) can reduce the load on the system clock signal (CKp), which is connected to only one die in each wafer, instead of 16,000 dice. However, this clock buffering method becomes a speed limiting factor for scan chain data I/O procedures. In our example, the propagation delay in each die is about 4 nsec, so that the total delay time is about 4 msec for the whole wafer. The data input port (475) in FIG. 4(g) needs to receive the data from the final output of the last scan chain in the wafer at the same clock. The period of CKp must be longer than the total delay time of the scan chain clock in the wafer. In the above example, the frequency of CKp is set at 50 KHz. The time to shift 32 K scan chain data is 0.64 seconds, which is adequate for testing purpose, but we need much faster data rate for other operations. One obvious method to reduce the scan chain data access time is to connect all the scan clock inputs (CKi) into one signal as illustrated in FIG. 5. The scan chain clock input pads (514) for all the dice are connected by both horizontal (512) and vertical (511) inter-dice connection lines. In this way, the frequency of CKp is no longer limited by the propagation delay of clock buffers (317); scan chain data shifting time can be shortened by many orders of magnitudes. However, the load on the clock signal (CKp) is also increased by 1000 times. The RC delay of the clock line becomes the speed limiting factor for this case.

Figure 6A:
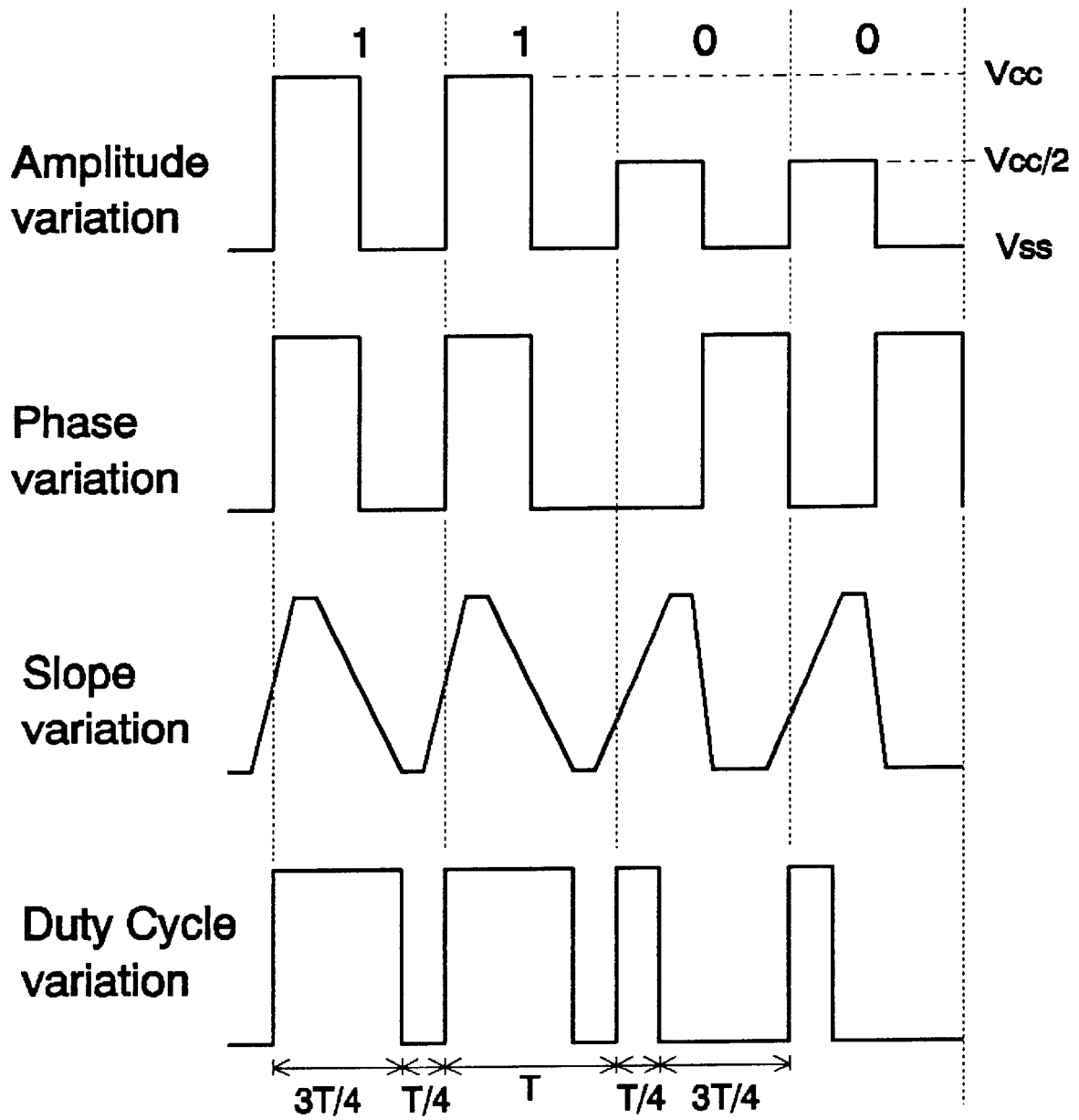
FIG. 6(a) shows four examples of single input scan chain data waveforms.

Another solution is to use a novel scan chain input signal (Ki) to support the functions provided by both CKi and Di. On the other word, this novel signal (Ki) must be able to tell the scan chain both the value of input data and the time when to shift the data into the scan chain. FIG. 6(a) shows a few methods to provide such scan chain input signals (Ki). The first waveform in FIG. 6(a) shows an amplitude variation method. Binary value "1" is represented by a pulse with full amplitude (Vcc), binary value "0" is represented by a pulse with half amplitude (Vcc/2), and the rising edge of the amplitude variation signal defines the time to shift data. The second waveform in FIG. 6(a) shows a phase variation method. The phase of an input pulse is shifted by 180 degrees to represent "0". This method is well known in the current art as the data transfer mechanism for local area networks. Another method is to modulate the slopes of the rising and following edges to represent different binary data as illustrated by the third waveform in FIG. 6(a). Yet another method is to modulate the duty cycle as illustrated by the forth waveform in FIG. 6(a).

Figure 6B:
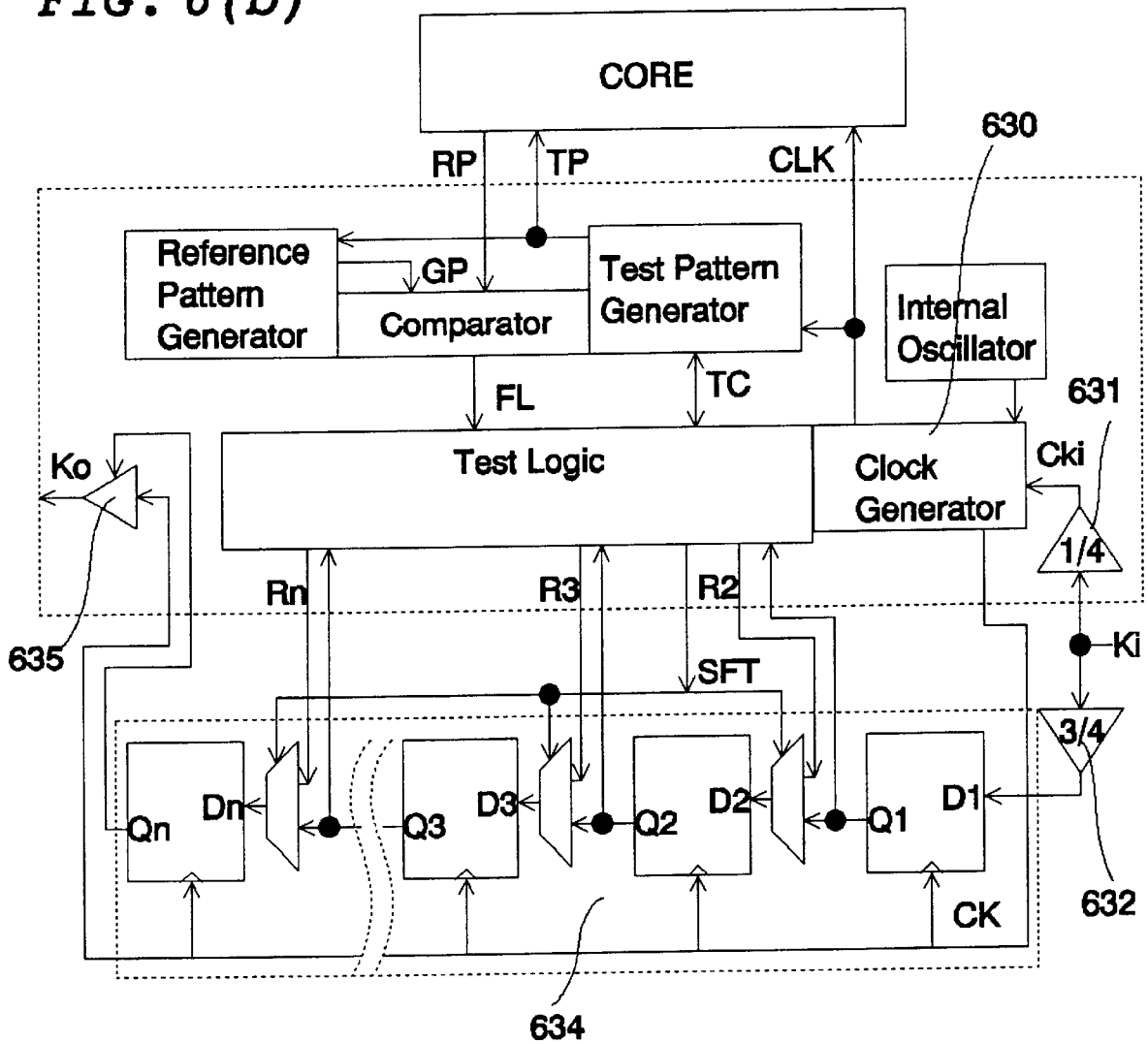
FIG. 6(b) describes the testing circuits supporting the amplitude variation signal in FIG. 6(a)

FIG. 6(b) shows the block diagram of the test circuits supporting the amplitude variation scan chain signal illustrated by the first waveform in FIG. 6(a). Almost all of the circuits in FIG. 6(b) are identical to those in FIG. 3(b), except three additional signal amplifiers (631, 632, 635). The clock signal amplifier (631) has a trigger point at ¼ Vcc; its output (Cki) is at full Vcc whenever the amplitude of its input signal (Ki) is higher than ¼ Vcc, and Cki is at Vss whenever the amplitude of the input signal (Ki) is lower than ¼ Vcc. In this way, Cki is identical to the scan chain clock input signal (CKi) in FIG. 3(a). The data signal amplifier (632) has a trigger point at ¾ Vcc; its output (D1) is at full Vcc whenever the amplitude of the input signal (Ki) is higher than ¾ Vcc, and D1 is at Vss whenever the amplitude of the input signal (Ki) is lower than ¾ Vcc. In this way, D1 is identical to the scan chain data input signal (Di) in FIG. 3(a). In order to propagate the last scan chain output data (Qn) to the next die, we need to use another signal amplifier (635) to convert Qn into the amplitude variation format, The output (Ko) of the output signal amplifier (635) equals Vcc when both Cki and Qn have logic value "1"; Ko equals ½ Vcc when Cki is "1" and Qn is "0"; it equals Vss when Cki is zero. Now it should be obvious for those familiar to the art that the functions of the circuits in FIG. 6(b) are identical to those in FIG. 3(a). To shorten the specifications of this patent application, we will not describe circuits supporting other waveforms in FIG. 6(a) because anyone familiar with the art can easily design those circuits after disclosure of the above example.

Figure 6C:
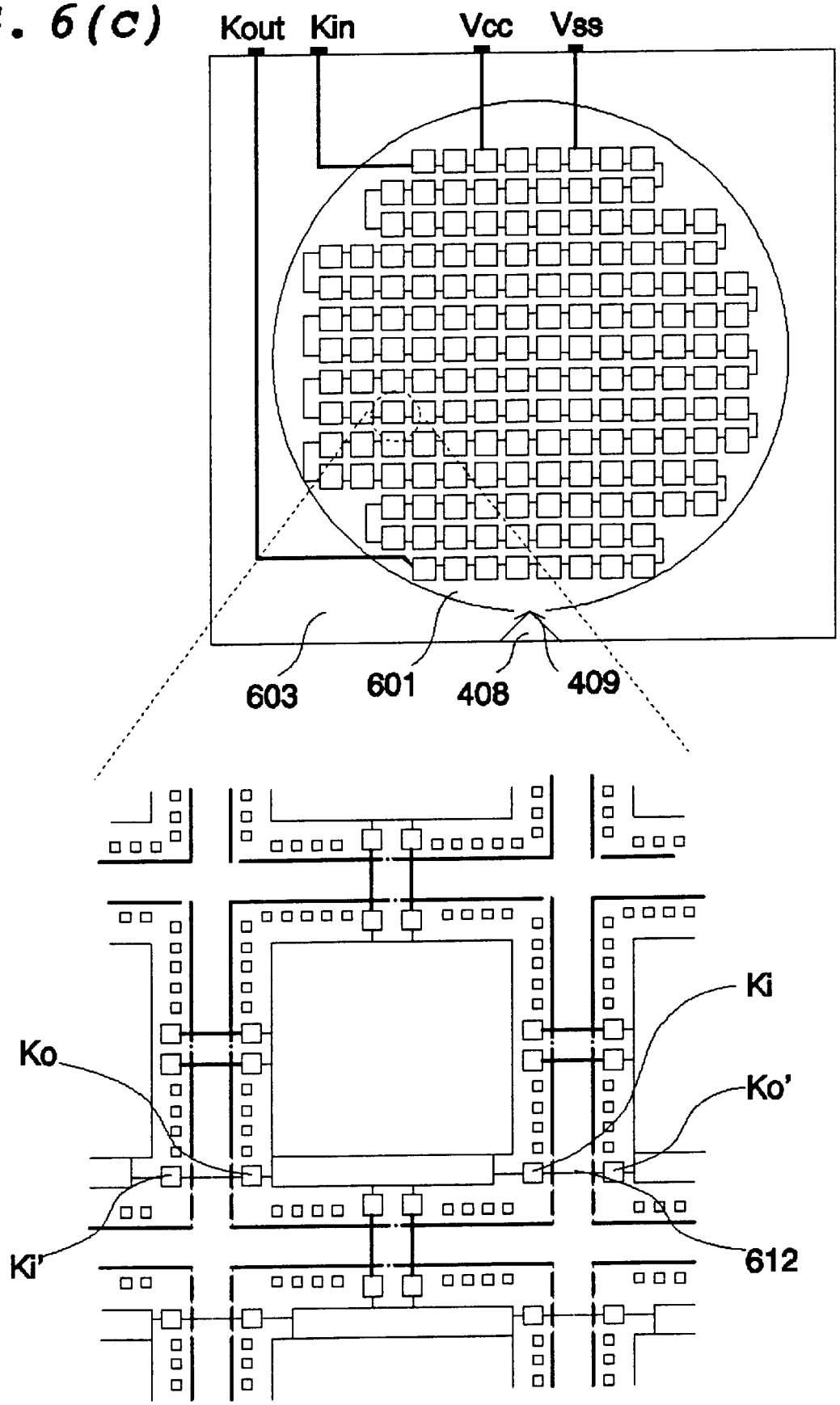
FIG. 6(c) illustrates the simplified wafer level connections using the amplitude variation signals in FIG. 6(a)
Figure 6D:
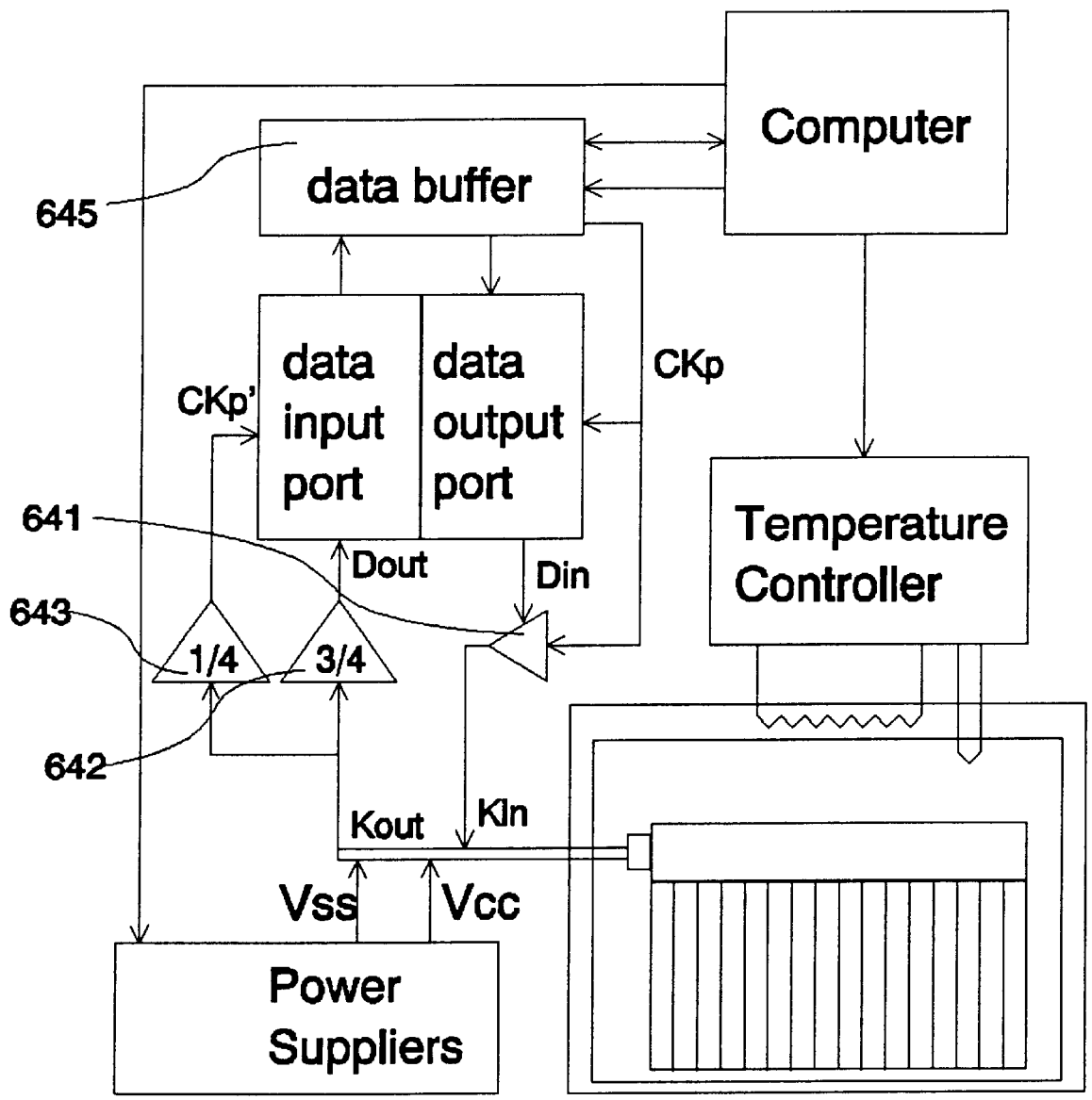
FIG. 6(d) is the block diagram of a testing system using the amplitude variation signals in FIG. 6(a)

Using the signal formats described in FIG. 6(a), each scan chain only needs one input pad (Ki) and one output pad (Ko) as shown in FIG. 6(c). Wafer level signal connections are simplified significantly because there is only one serial data path. The data input pin Din at the probe box (603) is replace by Kin, the data output pin Dout at the probe box is replaced by Kout; and we no longer need a clock pin. FIG. 6(d) illustrates a testing system supporting amplitude variation signals. This testing system is identical to the one in FIG. 4(g) except for three additional signal amplifiers. The first data amplifier (641), which has the same function as the output signal amplifier (635) in FIG. 6(c), converts the outputs of the data output port (Din) into amplitude variation input signals (Kin) to the wafers. The second data amplifier (642), which has the same function as the input data signal amplifier (632) in FIG. 6(c), converts the scan chain outputs (Kout) in amplitude variation format into binary data (Dout) pulses. The third signal converter (643), which has the same function as the input clock signal amplifier (631) in FIG. 6(c), converts the scan chain outputs (Kout) into a clock signal (Ckp'), which provides the timing control to store test results (Dout) back to the data buffer (645). In this method, the timing control (Ckp') for output data does not need to be synchronized with the timing control (Ckp) for input data. Therefore, scan chain data shifting can be operated at a much high frequency.

Figure 7A:
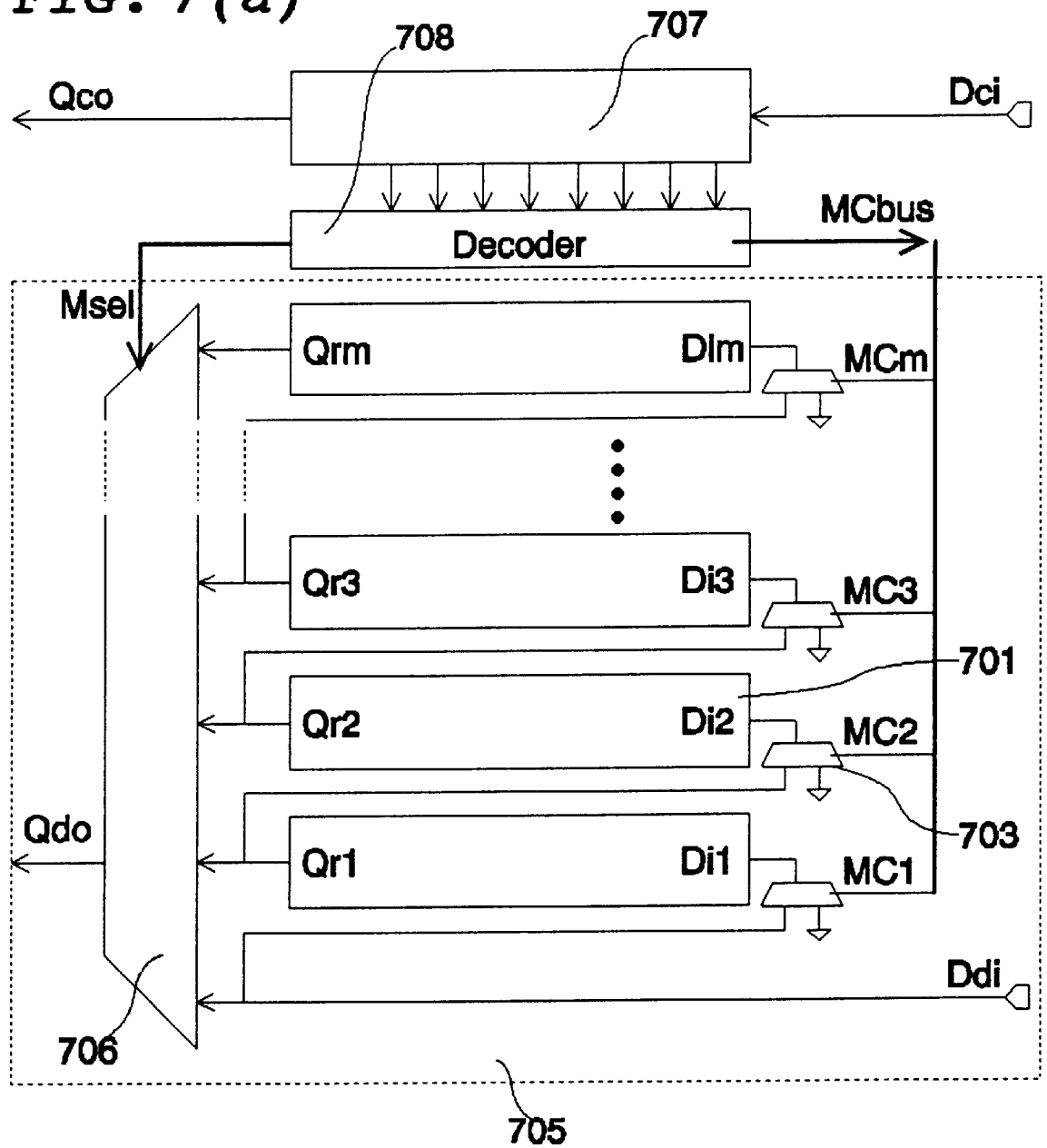
FIG. 7(a) shows the structures of a variable length scan chain.
Figure 7B:
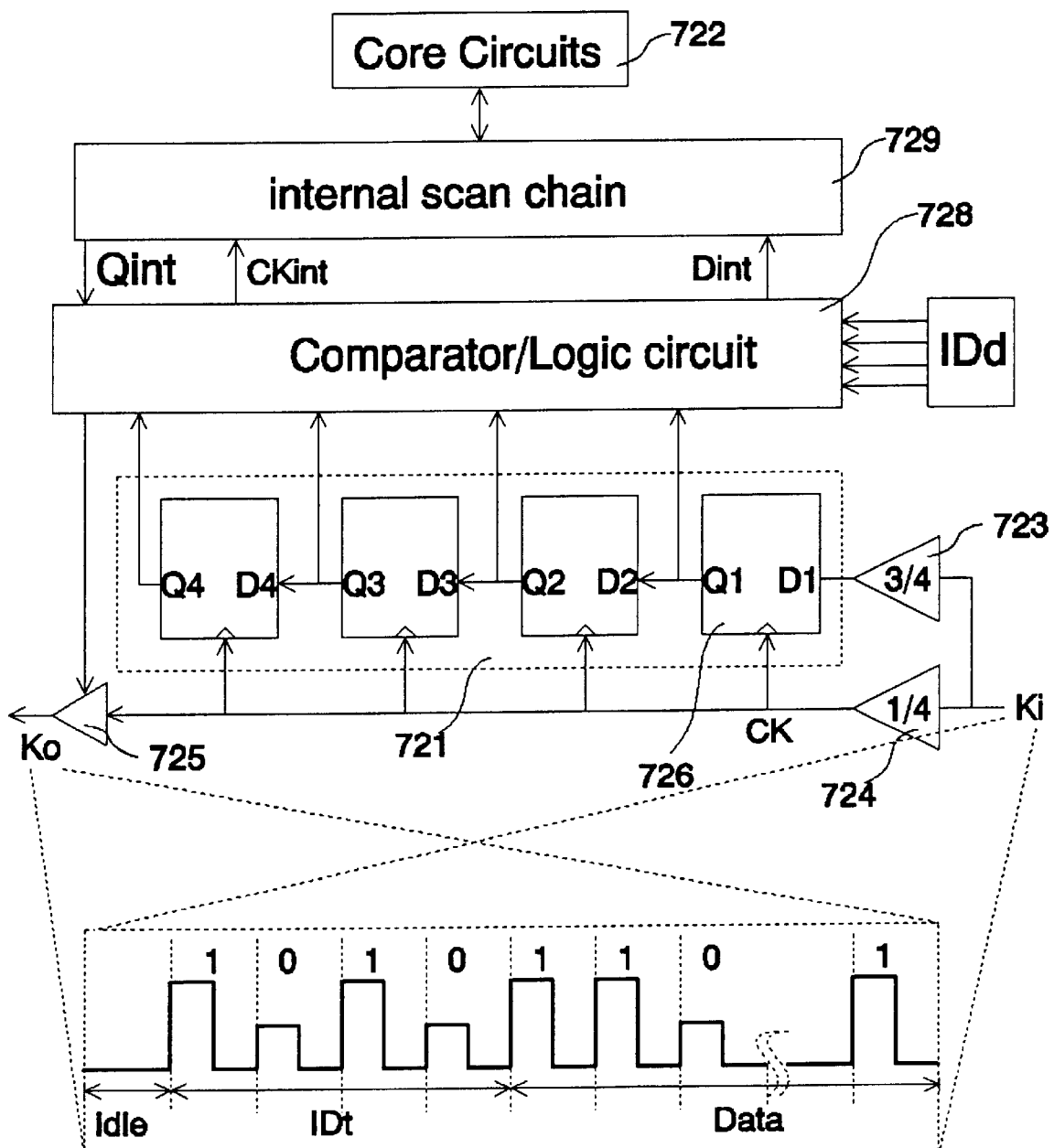
FIG. 7(b) shows another inter-dice data transfer mechanism that allows each die to be the initiator for test data transmission.
Figure 7C:
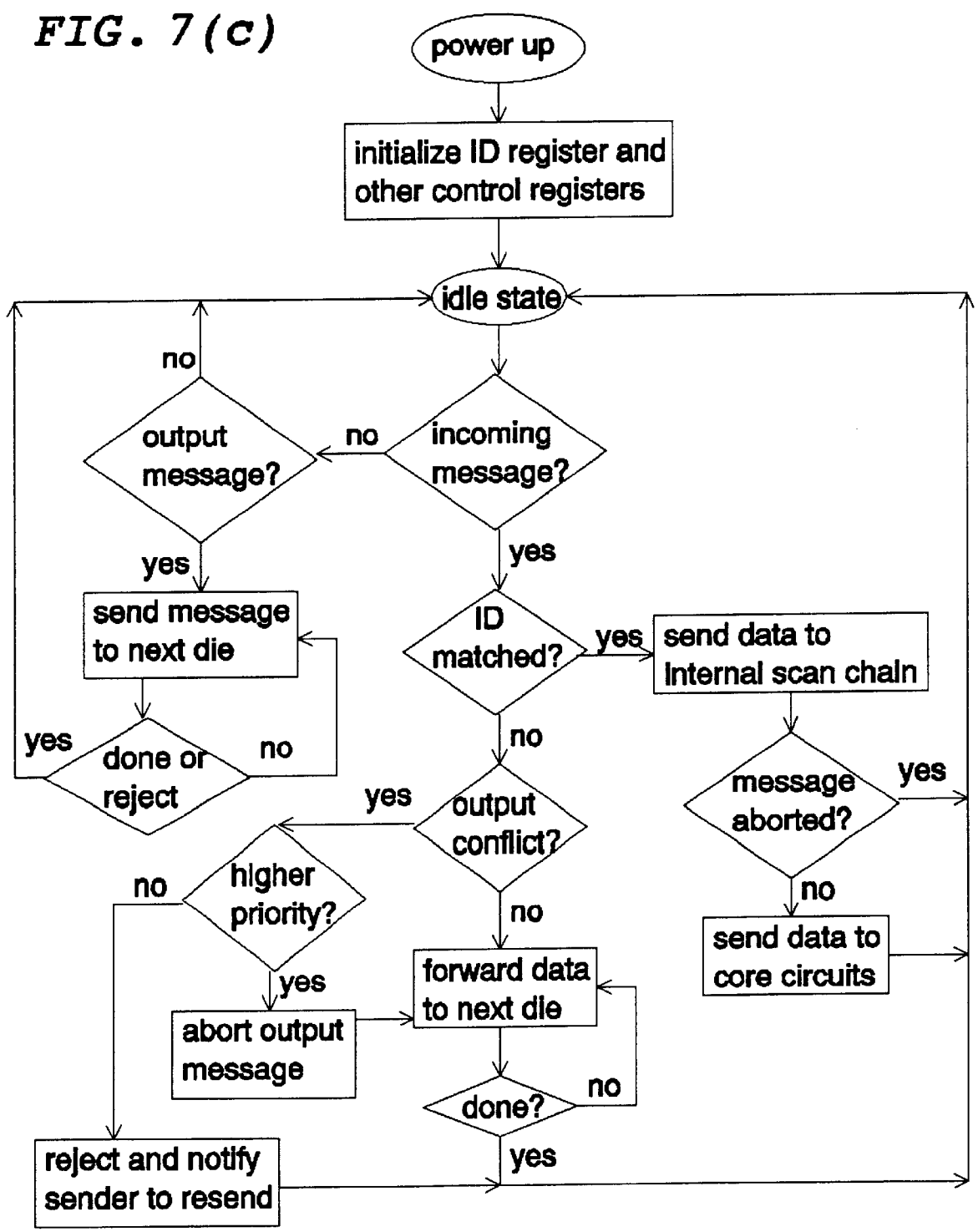
FIG. 7(c) is a float chart describing the data transfer mechanism in FIG. 7(b)

Another way to improve scan chain I/O data rate is to reduce the number of flip-flops on the chain. However, we do not want to sacrifice the number of test control signals (Q1–Qn) in each die. One solution is to use a variable length scan chain as illustrated in FIG. 7(a). This variable length scan chain (705) contains a plurality of sub chains (701), a plurality of input multiplexers (703), an output multiplexer (706), a decoder (708), and a separated control scan chain (707). The decoder (708) uses the outputs of the flip-flops in the control scan chain (707) to generate two sets of select signals (Msel, MCbus). The first set of select signals (Msel) select one and only one signal from the outputs of sub chains (Qr1, Qr2 . . . , Qrm) or the data chain input signal (Ddi) as the output signal (Qdo) sent to the next die. The other set of select signals (MCbus) control the inputs to the sub chains so that the last output to the variable scan chain is also the same signal selected by Msel; when Msel selects Ddi as Qdo, all sub scan chain inputs (Di1, Di2, . . . , Dim) are set to zero; when Msel selects Qr1 as Qdo, Ddi is sent to Di1 while Di2, Di3, . . . , Dim are all set to zero, and the length of the variable scan chain is the length of one sub scan chain; when Msel selects Qr2 as Qdo, Ddi is sent to Di1, Qr1 is sent to Di2, while Di3, . . . , Dim are all set to zero, and the length of the variable scan chain is the length of two sub scan chains; . . . , and when Msel selects Qrm as Qdo, Ddi is sent to Di1, Qr1 is sent to Di2, Qr2 is sent to Di3, . . . , and the length of the variable scan chain is the length of all sub scan chains combined. Using the variable scan chain in FIG. 7(a), we can set the length of each scan chain in every die by a separated control chain (707) so that we don't need to shift unnecessary data into the wafer level scan chains. For example, if we only want to send data to one of the dice in the whole wafer, we can set the length of the scan chain in all the other dice to zero to save transfer time. The variable scan chain also provides a method to avoid defective dice by setting the length of scan chains in a defective die to zero. The control signals determining the length of variable scan chains also can be determined by internal logic in each die. It is also possible for one of the die to initiate scan chain shift operations if the output signal Qdo is generated by internal logic circuits. FIG. 7(b) describes another high speed wafer level serial data transfer mechanism. The input and output signals (Ki, Ko) used for this example are amplitude variation signals in a special format; the first four pulses of the serial signals always contain a 4-bit target identification numbers (IDt) as illustrated by the waveform in FIG. 7(b). The amplitude variation input signal (Ki) received from previous die is sent to a clock signal amplifier (724), which is identical to the one (631) in FIG. 6(b), to generate the control clock (CK) of a 4-bit shift register (721). The input signal (Ki) is also sent to a data signal amplifier (723), which is identical to the one (632) in FIG. 6(b), to generate the input to the first flip-flop (D1) of the shift register (721). After the first four pulses are received, the 4-bit shift register latches the die identification number (IDt). These latched IDt number (Q1–Q4) are sent to a comparator/logic circuit (728) which determines data transfer procedures according to the float chart in FIG. 7(c). After power down initialization, each die in the wafer is programmed with a unique die identification number (IDd). When an incoming message is received from previous die, the incoming IDt is compared with IDd. If those two identification numbers are identical, the remaining scan chain data are shifted into an internal scan chain (729). If the data transfer procedures are not aborted, those data will be sent to core circuits (722) after the data are completely received. If those two ID's are not identical, which means this die is not the destination of the incoming message, the comparator/logic circuit (728) checks the output circuits to see if there is a conflict. If no there is no conflict, the incoming message are forwarded to the next die as output signal Ko. If this die is sending a higher priority message to the next die, the incoming task would be rejected, and the sender would be notified to re-send the data. The reject notification is executed through another serial data transfer circuit traveling in opposite direction, which is not shown in FIG. 7(b). The comparator/logic circuit (728) also can initiate an outgoing message to other dice, as shown by the float charge in FIG. 7(c). The data transfer methods in FIGS. 7(b,c) are more flexible then that in FIG. 7(a). An input message stops at its receiver; no wasted data shifting activities. It also allows any die to initiate a message to external system or to a different die; outputs are therefore triggered when they are ready, instead of waiting for an external output procedure.

Figure 7D:
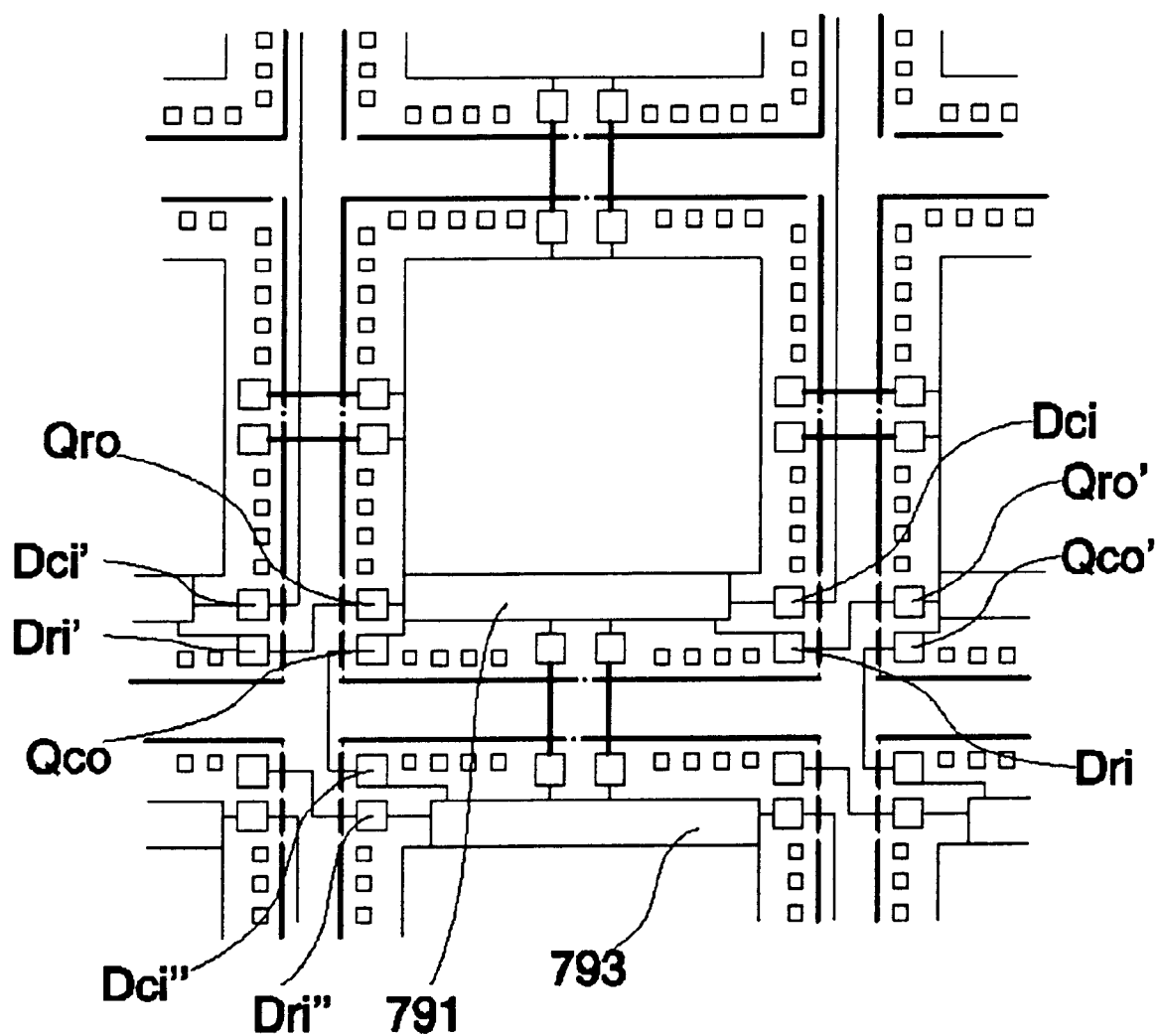
FIG. 7(d) shows the physical structures of an application of the variable length scan chain.

The advantages of these variable length scan chains are further demonstrated by a practical example. The IC product in this example has 1,000 dice in each wafer. Each die has a variable length scan chain (791) that has two data inputs (Dri, Dci) and two data outputs (Qro, Qco) as illustrated in FIG. 7(d). The dice in nearby rows are rotated by 180 degrees so that scan chains in nearby rows are traveling at opposite directions. The row data input (Dri) is connected to the row data output (Qro') of previous die in the same row. The column data input (Dci) is connected to the column data output (not shown) of the nearby die in the upper column. The row data output (Qro) is connected to the row data input (Dri') of next die in the same row. The column data output (Qco) is connected to the column data input (DciΔ) of the nearby die in the same column. Those two inputs (Dr1, Dci) are processed with logic "OR" function so that the scan chain responses to any one of the inputs. The scan chain outputs are dependent on one control bit (Dcr) in each die. This control bit is initiated to be "0" after power up reset, and it can be set through one scan chain flip-flop output (Q01). When Dcr is "0", Qco is always zero, and the scan chain output is sent to Qro; on the other word, the scan chain data shift to the next die in the same row when Dcr is "0". When Dcr is "1", Qro is always zero, and the scan chain output is sent to Qco; on the other word, the scan chain data shift to the nearby die in the next column when Dcr is set to "1". Each scan chain (791) has 4 sub chains. The outputs of the flip-flops in the variable length scan chain are described in Table II.

Figure 7E:
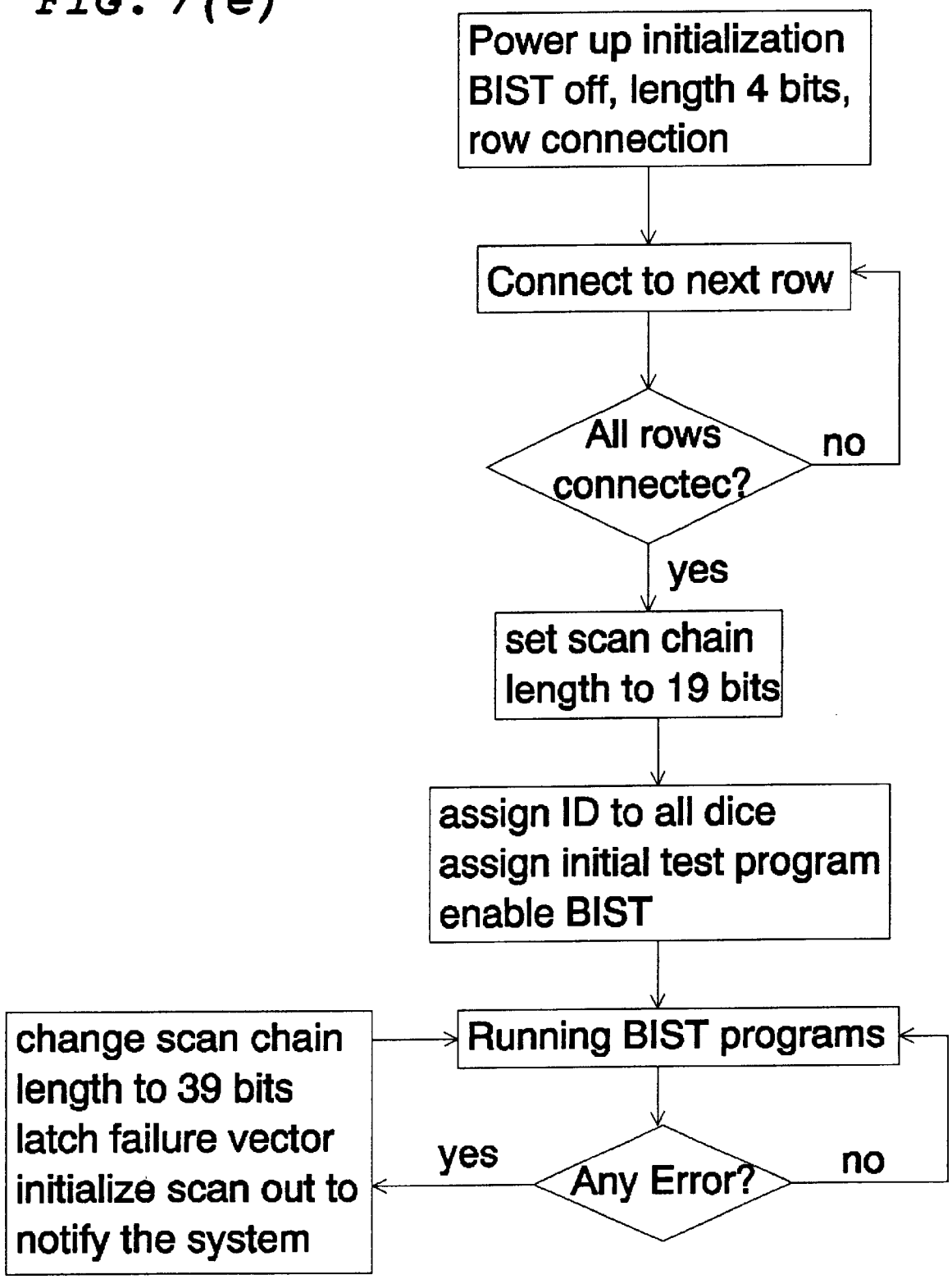
FIG. 7(e) is a float chart for the testing procedures of the system in FIG. 7(d)

The above scan chain structure allow us to configure the scan chain electrically using the testing procedures illustrated by the float chart in FIG. 7(e). After power up, all the scan chain flip-flop outputs (Q49–Q00) are reset to "0". The length of the variable scan chain (791) is therefore equal to the length of sub chain 0, which has 4 bits. At this time, all the scan chains are connected along row direction; only the dice in the top row of the wafer is available to external control signals. The external controller must shift data into the scan chain to set the Dcr signal of the last die in the first row to "1" so that the dice in the second row are linked. The next procedure is to set signal Dcr of the last die in the second row to "1". Following similar procedures, we can link every row on the wafer one by one until all the scan chains on the wafer are linked into a big scan chain. If the scan chain in one of the die is not functional, we can bypass that die by programming the Dcr signal in the die before the bad die. The above procedures appear to be lengthy, but it actually takes less than 1 msec. Those procedures can be executed quickly because (a)the scan chain has only 4 bits at this time, and (b)50 MHz amplitude variation signals are used by those scan chains.

After all the functional scan chains on the wafer has been linked into a big chain, the length of the chain is set to three sub chains by a data shifting procedure. In the next scan chain input procedure, each die is given a unique identification number (10 bits). The first test program to be executed is initialized by setting the 5-bit initial test program number, and the BIST enable signal is set. Parallel testing are then executed in all 1000 dice on the wafer shortly after the data shifting procedure is done. Whenever an error is detected, the internal test logic circuits will automatically set its scan chain length to full length, then initiate a scan chain shift operation to output 39-bit failure information to external controllers.

TABLE II

Definition of variable length scan chain outputs

| Flip-flop outputs | Sub scan chain number | Descriptions |
|---|---|---|
| Q00 | 0 | BIST enable signal |
| Q01 | 0 | output direction: "1" for column, "0" for row |
| Q03–Q02 | 0 | number of active sub scan chains |
| Q13–Q10 | 1 | current or the first failed testing program configured as 5-bit counter with Q14 |

TABLE II-continued

Definition of variable length scan chain outputs

| Flip-flop outputs | Sub scan chain number | Descriptions |
| --- | --- | --- |
| Q14 | 1 | current or the first failed testing frequency: "1" for 320 MHz, "0" for 20 MHz |
| Q29-Q20 | 2 | 10-bit die identification number |
| Q49-Q30 | 3 | 20-bit failure vector |

The testing features described in the above example are especially convenient to support burn-in tests. The electrical scan chain linking methods allow flexibility to bypass defective dice. After the initial procedures, thousands of dice can be tested simultaneously. There is no need for external tester to check the results because reliability failures will report its own failure conditions automatically.

In accordance with conventional IC fabrication techniques, wafers are normally cut or scribed to separate individual IC dice after fabrication is completed. Each individual die must has its own seal ring and bonding pads so that it can be bounded to a lead frame and packaged to function as an individual product. These seal rings and bonding pads are the major obstacles for inter-dice connections. The space available for inter-dice connections is therefore limited. That is why we have tried to minimize the number of inter-dice connection wires in previous examples. Those circuits are adequate to support wafer level testing and burn-in as demonstrated in previous example. However, the present invention is not just useful to transfer low bandwidth testing signals. We can build extremely powerful products using the inter-dice data transfer methods of the present invention, as demonstrated by the example shown in FIGS. 8(a-d).

Figure 8A:
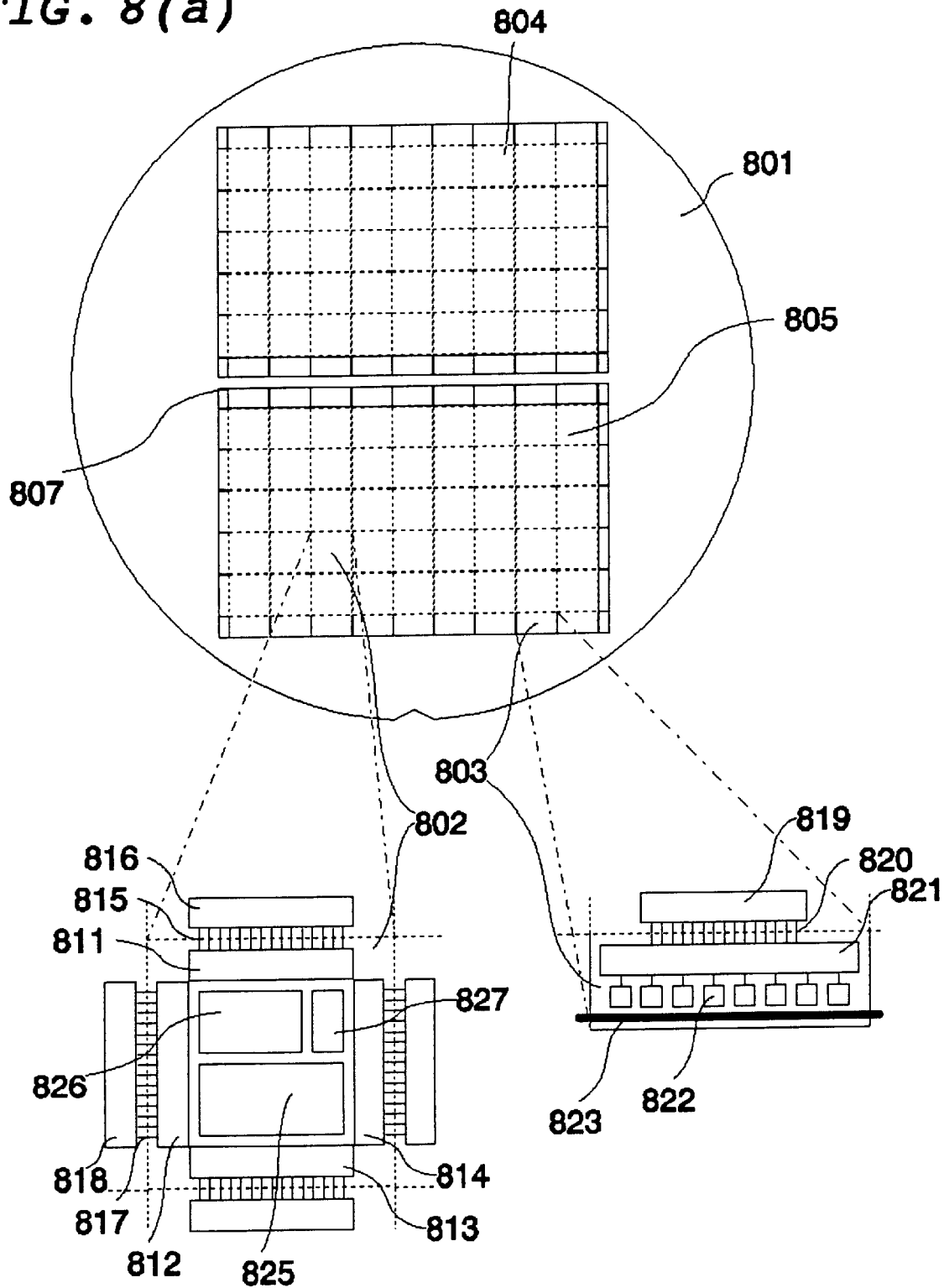
FIG. 8(a) illustrates the physical structures of multiple dice integrated circuits of the present invention.

FIG. 8(a) shows the structures of a multiple-die-integrated-circuit (MDIC) of the present invention. The dice on each wafer 801 are divided into groups of MDIC's (804,805). The MDIC's (804, 805) are spaced apart by scribing lanes (807). Each MDIC (804, 805) contains two types of dice called "core dice" (802) and "I/O dice" (803). Conventionally, an IC die is defined by scribing lanes surrounding the die. The dice in an MDIC of the present invention are not necessarily separated by scribing lane. A die in this case is defined by optical lithographic stepping unit or by computer aid design (CAD) layout unit. In this example, one MDIC is actually one individual IC product. A die is defined as one IC that has its own inter-dice communication circuits. The core dice (802) do not need to have seal rings or bonding pads. Each core die 802 communicates with nearby dice by inter-dice data transfer circuits (811–814). There are no obstacles such as seal rings or bonding pads between nearby dice. Inter-dice connections can be a few $\mu$m long and less than 1 $\mu$m wide. It is therefore possible to have thousands of signal lines (815, 817) between nearby dice. Inter-dice connections for power lines and clock lines are also conveniently available. The peripherals of a MDIC (804,805) are surrounded by I/O dice (803). Each I/O die (803) contains /0 data transfer circuitry (821) that has I/O drivers, bus control logic circuits, and bonding pads (822) to support communication with external circuits. The I/O data transfer circuitry also communicates with the inter-dice data transfer circuit (819) of a nearby core die. The I/O dice (803) also have seal rings (823) to form a complete moisture barrier for each MDIC (804, 805).

Figure 8B:
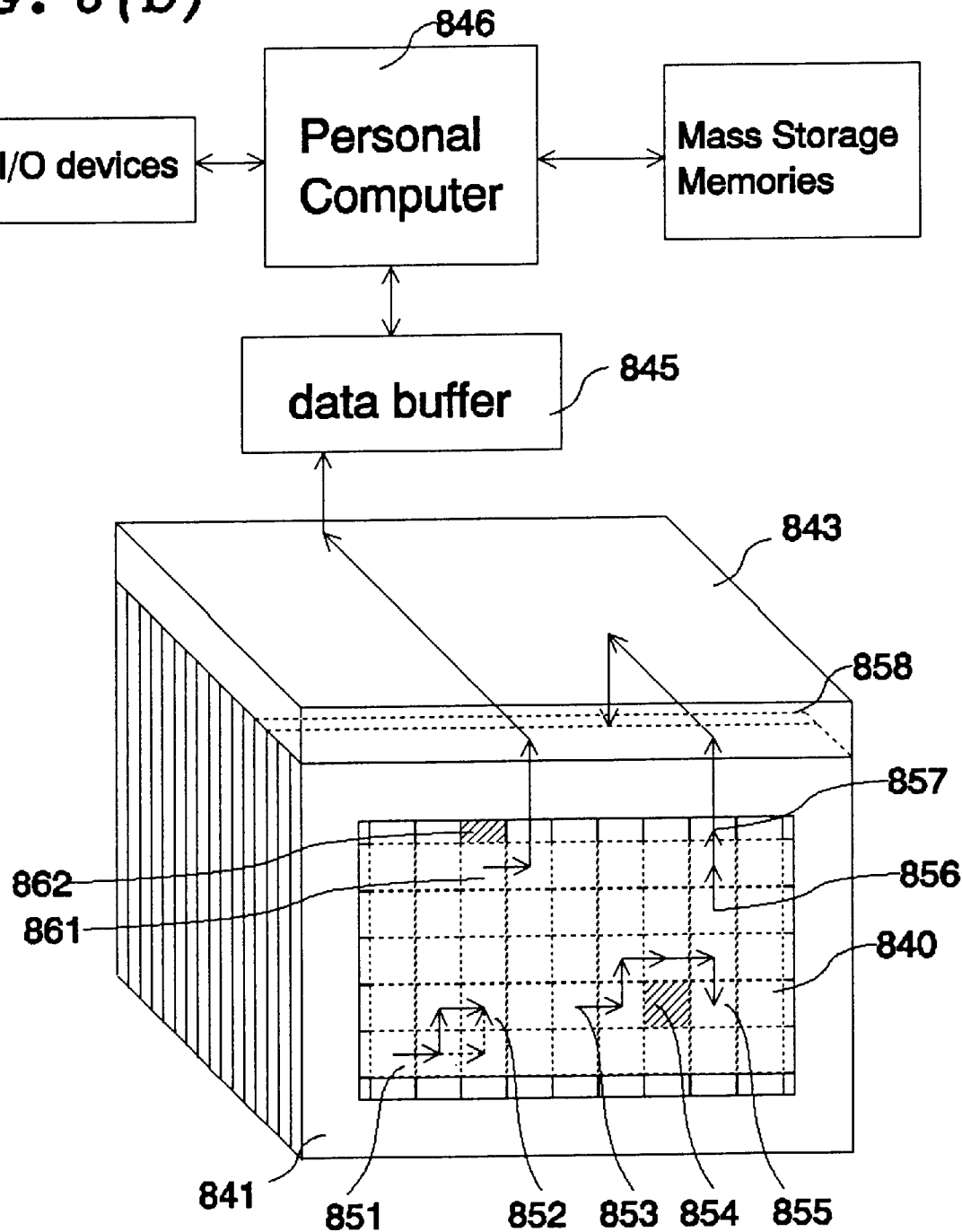
FIG. 8(b) describes the system configuration of a powerful computer using 16 multiple dice integrated circuits.
Figure 8C:
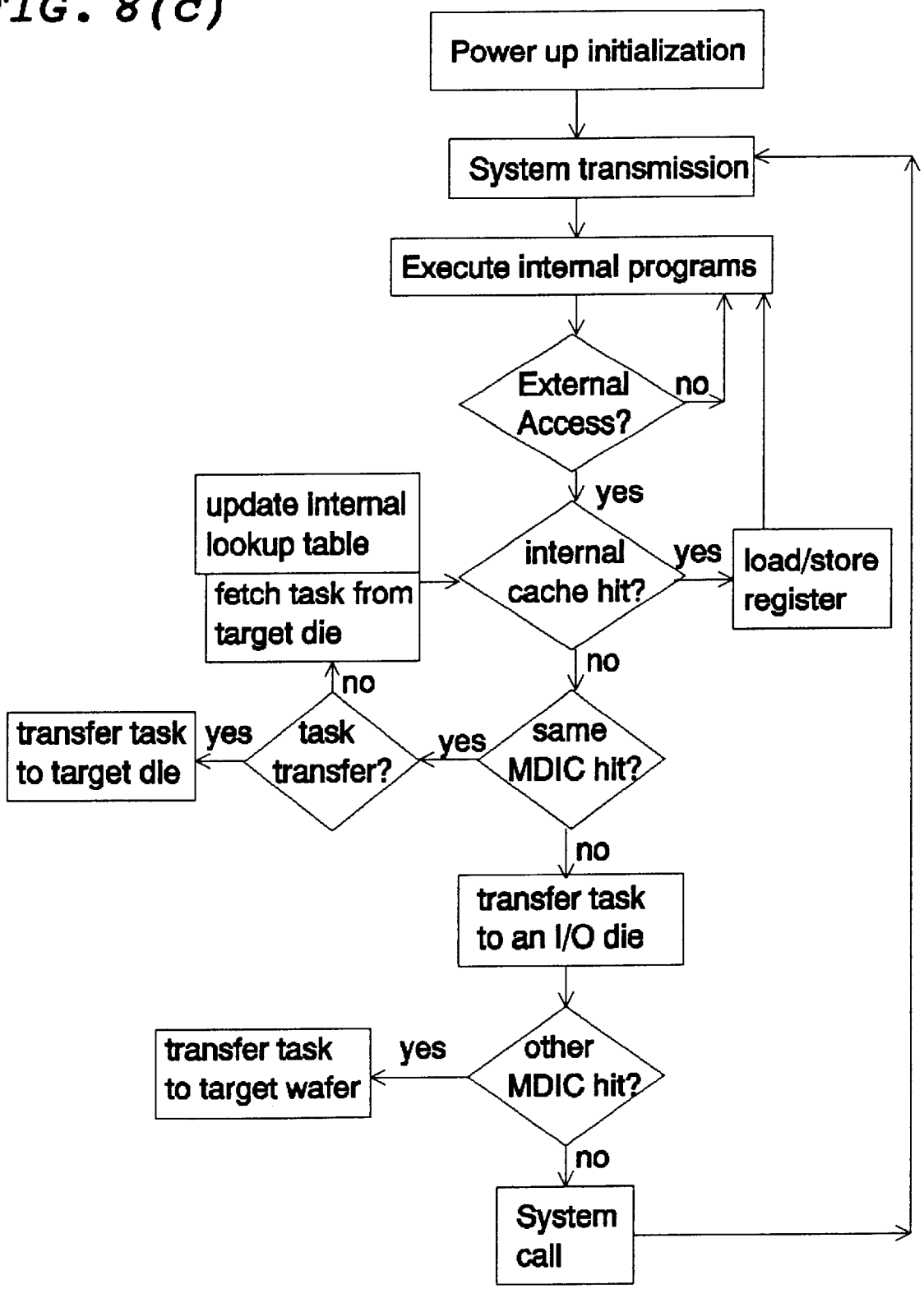
FIG. 8(c) is a float chart describing the inter-dice data transfer mechanism of the computer in FIG. 8(b)

FIG. 8(b) shows a system using 16 MDIC's of the present invention. The MDIC's (840) have been cut and separated from wafers. Each MDIC is supported by a bonding card (841). The bonding card (841) provides signal and power connections (not shown) to the bonding pads in I/O dice of the MDIC's (804) using conventional bonding wires. A cable box (843) provides connections (not shown) between those bonding cards (841, 858) and the connections to external circuits. A personal computer (846) communicates with the MDIC through a data buffer (845). The computer (846) also communicates with mass storage memories and external I/O devices. Every die in those MDIC's has been tested. Bad dice (854,862) failed previous tests are marked with shaded area in FIG. 8(b). The computer remembers the errors found in those bad dice (854, 862), and avoids using them to execute functions known to fail. It also initializes the control signals of the inter-dice data transfer circuits in the MDIC so that bad dice can be avoided during data transfer procedures. FIG. 8(b) shows examples of data transfer procedures of the system. A transfer procedure initiated by one core die (853) went around a bad die (854) to reach a target die (855). Another transfer procedure starts from a core die (856) in the first MDIC (840), went to an I/O die (857) at its edge, then reaches another MDIC card (858). Another transfer procedure is blocked by a bad I/O die (862) so that the initiating die (861) must go around the bad I/O die (862) to send the data through the cable box (843) to the external data buffer (845). Another transfer procedure started from one die (851) to a target die (852). There are multiple ways to reach the target die. The data transfer logic in each die is able to find the most efficient path to reach its target. These and other data transfer procedures are controlled by logic circuits in each die based on the floating charts in FIGS. 8(c,d).

Figure 8D:
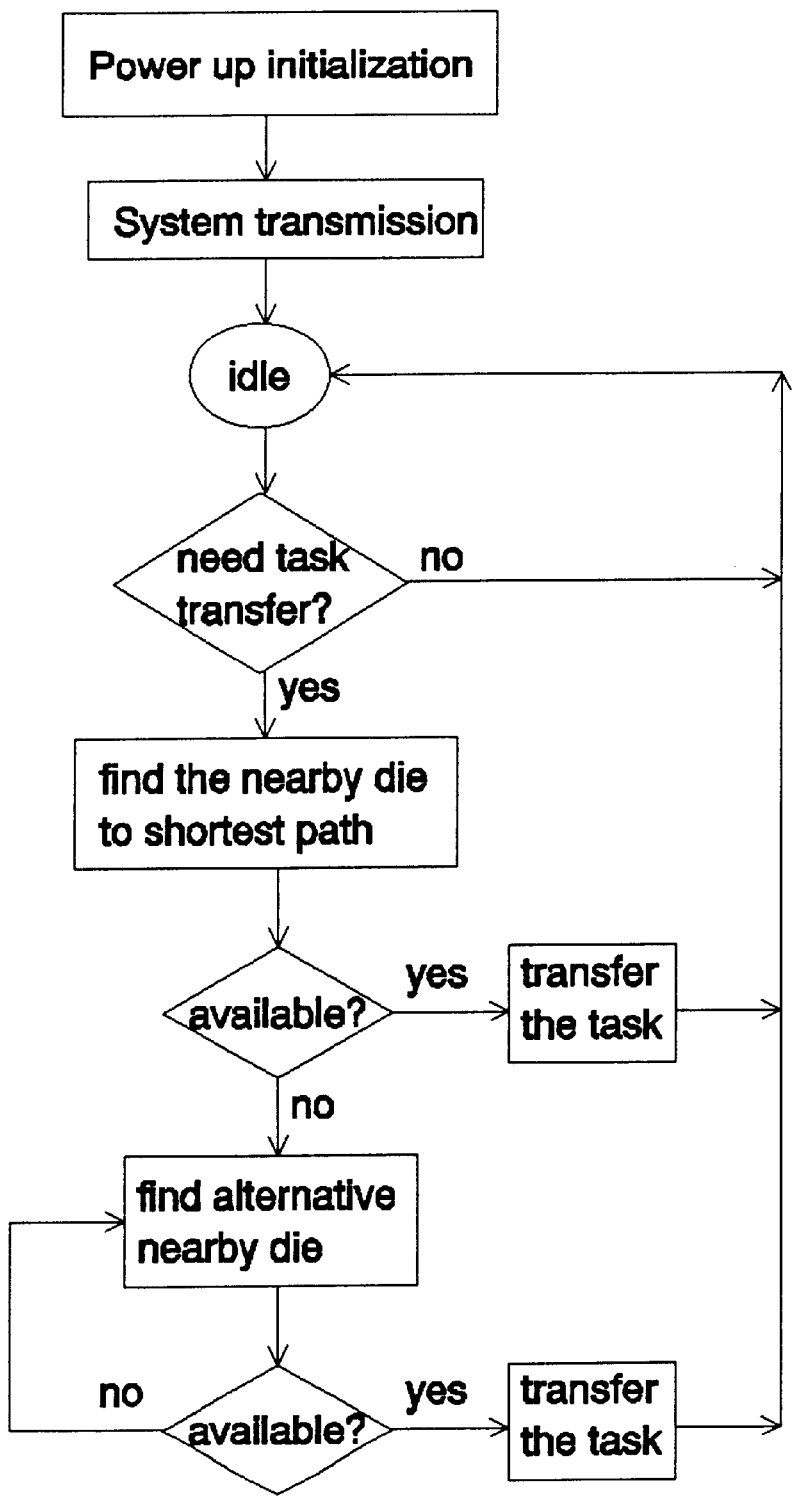
FIG. 8(d) is a float chart describing the control logic of the inter-dice data transfer mechanism of the IC in FIG. 8(a)
Figure 8E:
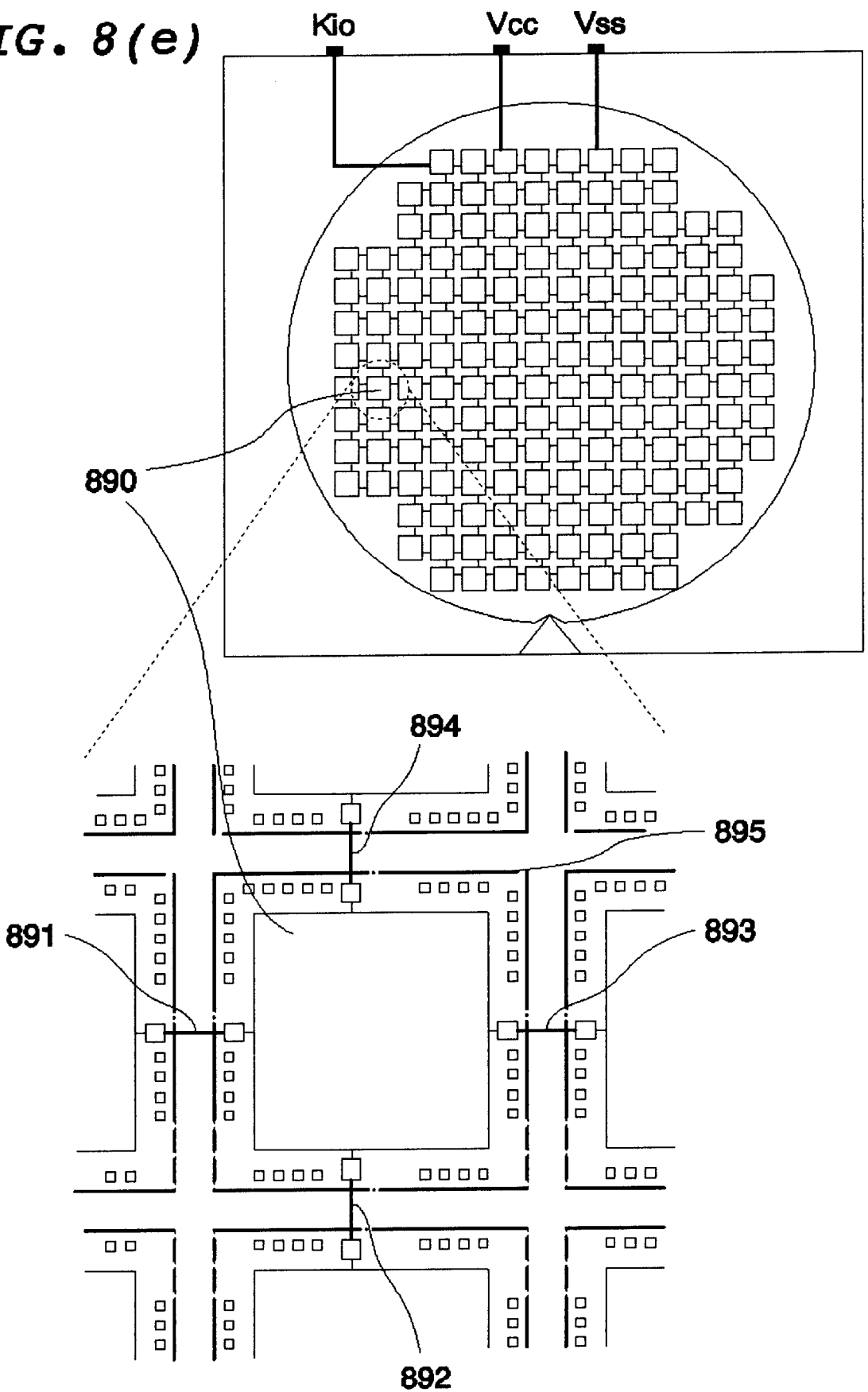
FIG. 8(e) shows the structures of a two-dimensional inter-dice signal transfer method supporting wafer level tests.

After power up initialization procedures, all the dice in all MDIC are ready to receive system transfer signals. The computer (846) knows the locations and the problems of all bad dice, and it also knows the function of all dice in all MDIC. It starts a system transmission procedure that writes programs and initial data to each die, and initializes the control signals to direct inter-dice data transfer circuits in all dice. After the system transmission procedures are done, each functional die starts to execute internal programs provided by the system. The programs stop only when the programs need external accesses such as memory load/store procedures or subroutine calls. If the required data or instructions are found in the internal cache in each die, the die can complete the access by itself If internal cache can not finish the access, an internal lookup table is checked to find the location of the target data, and a task transfer procedure is started. Because both the target die and the initiating die have their own arithmetic logic unit (ALU), both of them may have the capability to finish the job. The internal logic needs to determine which way is more efficient. Most of time, it is more efficient to transfer the task to the target die. In some case it is more efficient to ask the target die to send necessary information for the initiating die to finish the task. In case that the information is not in the same MDIC, the task is transferred to an I/O die that has the logic circuit to transfer the task to another MDIC or to request system supports. The above data transfer procedures are executed by a series of inter-dice data transfer procedures. FIG. 8(d) is a float chart describing the control logic to find the best way to transfer data to the proper destination. After power up and system transmission, the data transfer logic stay at idle state until a task transfer is started either by nearby dice or by the internal program of the same die. The transfer logic checks the target location to find which one of the nearby die is the best candidate to transfer the task. If the selected nearby die is available (functional and not occupied), then the task is transferred. If the selected nearby die is not available, a second selection is made, and the procedures continue until the task is transferred.

The above data transfer methods allow high bandwidth communication between nearby dice in multiple directions. Because there is no need to use long metal lines, the inter-dice data communication can have extremely high bandwidth. Transfers to farther dice or external devices are done by a series of inter-dice transfers. Multiple task transfer activities can happen simultaneously. Multiple routs are available between an initiator and its destination so that unavailable resources can be bypassed. These two-dimensional inter-dice data transfer methods make it possible to build extremely powerful products. The advantages of the present invention can be demonstrated by a practical example. In this example, each system has 16 MDIC's, and each MDIC has 256 core dice arranged in 16 rows by 16 columns. Each core die (802) is a microprocessor that contains a 64-bit ALU with 128-bit floating point calculation unit (826), a 1 K 64/128-bit register file (827), and a 286 Kbyte internal cache (825). The internal cache (825) is divided into one data cache and one instruction cache. These microprocessors are much smaller in area and much simpler in logic structure than current art microprocessors. Inter-dice data transfer circuits (811–814) are placed at four sides of the core die (802). Because there are no bounding pads and seal rings between nearby dice, each transfer circuit (811–814) can have 4thousand inter-dice signal lines connected between two nearby dice. The internal clock rate for core dice is 320 MHz. In each MDIC we have 256 ALU's, 256 K registers, and 64 Mbytes of caches. The maximum computation rate is therefore 64 billion instructions per seconds (GIPS) for each MDIC, and 1,024 GIPS for the whole system. In reality, the actual computation power is strongly related to the application software and the data transfer capabilities of the system. The key element to reach highest performance is the capability to transfer data and instructions to support as many parallel processing tasks as possible. The data bus bandwidth is about one trillion bits per second between nearby dice. The two-dimensional inter-dice data transfer methods of the present invention allow flexible and convenient data transfer between any two dice on the same MDIC. The bandwidth is therefore high enough to allow near-ideal calculation rates for application programs that can be run in one MDIC. The communications between MDIC's are controlled by I/O dice, which need to have bonding pads and large I/O drivers to support external data transfer. The data transfer bus between MDIC's is 64 bits wide at 66 MHz. The bandwidth of this bus is by far lower than that of the inter-dice buses. It is therefore necessary to reduce inter-MDIC transfers as much as possible. The application software must execute closely related subroutines at core dice close to one another to obtain high performance. With proper software supports, an MDIC computer in this example is by far more powerful than current art super computers.

The flexibility to avoid defective circuits is extremely important to build powerful MDIC of the present invention. A prior art IC product is not useful when there is any defect in a die; a die is abandoned whenever any one of its millions of components is defective. The yields of prior art IC products therefore decrease exponentially with increasing area. An MDIC of the present invention can be viewed as an IC with very large area. We are able to build MDIC with very high yield because of the flexibility to avoid defective circuits. Defective dice are either not used or used for their non-defective functions. For example, a die with one defective inter-dice data transfer circuit is still useful because the other three inter-dice data transfer circuits still can support all possible transfers as soon as the system can avoid the bad one. An ALU with defective floating point unit is still useful if the computer do not assign floating point tasks to the ALU. One defective bit in a big cache should not fail the whole die if the system knows which part of the memory should not be used. Even when one die is completely useless, the data transfer methods of the present invention will be able to bypass the bad die. The same method is also used to go around a busy die using alternative routs.

Power consumption is an important factor for an MDIC product. The maximum number of MDIC placed in one system is typically limited by power or noise considerations. Because there is no need to use bonding pads or large drivers, the loading on each inter-dice connection line is very low (typically less than 0.01 pF). The power consumed by the inter-dice data transfer circuits is therefore much lower than current art I/O circuits. It is therefore possible to transfer thousands of signals at very high frequency with small power consumption.

The system configuration of the MDIC computer is very flexible. The system can have a combination of different MDIC such as floating point processors, memory, graphic controller . . . etc. The core dice in each MDIC can have different functions. It is very easy to change the number of MDIC in the system. Each MDIC can be easily replaced when a better product is available. An MDIC also can be a large memory block that contains billions of memory bits.

The two-dimensional inter-dice signal transfer methods also can be used for testing purpose as illustrated by FIG. 8(*e*). In this example, each die (890) has inter-dice signal lines (891–894) connected to all of its nearby die. The inter-dice signals are transferred in amplitude variation format. The same signal line are used for both input and output purpose. The testing circuitry for this example is identical to that in FIG. 6(*b*) except: (a)both the input (Ki) and the output (Ko) nodes are connected to the same line (Kio); (b)the output node of the data output amplifier (635) is at high impedance state whenever there are external input activities; and the data transfer lines (Kio) are actually 4 different signals connected to and from many nearby dice. The signal transfer mechanism between multiple dice is identical to that of the MDIC's described in FIGS. 8(*c,d*). Each dice(890) still can have seal rings (895) when the number of inter-dice signal is low. This two-dimensional inter-dice signal transfer system allows full flexibility to avoid defective dice, which is often the most important requirement for wafer level tests. Only one external signal (Kio) and power lines (Vcc, Vss) are needed to support all tests. The external data signal (Kio) can be probed to any one die in the wafer because we can propagate I/O signals to any die in the wafer in two-dimensional routs.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A method of testing a semiconductor wafer having a plurality of integrated circuit (IC) dice comprising:
    a) applying a plurality of testing signals on one of said dice and forming an inter-dice conductive line connected directly between immediate neighboring dice for transmitting said testing signals from one of said dice only to an immediate neighboring die.
2. The method of claim 1 further comprising:
    b) forming a data transfer control circuit for controlling a testing signal input and a testing signal output transferred from one of said dice.

* * * * *